United States Patent
Wang et al.

(10) Patent No.: US 8,275,223 B2
(45) Date of Patent: Sep. 25, 2012

(54) OPTO-ELECTRICAL HYBRID WIRING BOARD AND METHOD FOR MANUFACTURING THE SAME

(75) Inventors: Dongdong Wang, Torrance, CA (US); Masataka Ito, Torrance, CA (US)

(73) Assignee: Ibiden Co., Ltd., Ogaki-shi (JP)

( * ) Notice: Subject to any disclaimer, the term of this patent is extended or adjusted under 35 U.S.C. 154(b) by 339 days.

(21) Appl. No.: 12/610,561

(22) Filed: Nov. 2, 2009

(65) Prior Publication Data

US 2010/0195967 A1    Aug. 5, 2010

Related U.S. Application Data

(60) Provisional application No. 61/149,035, filed on Feb. 2, 2009.

(51) Int. Cl.
*G02B 6/12* (2006.01)
(52) U.S. Cl. .......................................... 385/14
(58) Field of Classification Search .................. None
See application file for complete search history.

(56) References Cited

U.S. PATENT DOCUMENTS

| | | | |
|---|---|---|---|
| 7,130,511 B2 | 10/2006 | Riester et al. | |
| 7,336,864 B2 * | 2/2008 | Dellmann et al. | 385/14 |
| 7,717,628 B2 * | 5/2010 | Hwang et al. | 385/88 |
| 2008/0075405 A1 | 3/2008 | Wang et al. | |
| 2009/0028497 A1 * | 1/2009 | Kodama et al. | 385/14 |

FOREIGN PATENT DOCUMENTS

WO    WO 2007111236 A1 *  10/2007

\* cited by examiner

*Primary Examiner* — Omar Rojas
(74) *Attorney, Agent, or Firm* — Oblon, Spivak, McClelland, Maier & Neustadt, L.L.P.

(57) ABSTRACT

An opto-electrical hybrid wiring board is formed with a flexible wiring board; a first rigid wiring board and second rigid wiring board connected to each other by the flexible wiring board; a light-emitting element and a light-receiving element, one of which is arranged on the first rigid wiring board and the other on the second rigid wiring board; and a flexible optical waveguide for optically connecting the light-emitting element and the light-receiving element. One end of the flexible wiring board is inserted in and supported by the first rigid wiring board, and the other end is inserted in and supported by the second rigid wiring board; the rigid wiring boards and flexible wiring board are electrically connected to each other by using vias to connect the wiring of the first and second rigid wiring boards and the wiring of the flexible wiring board at the inserted portions.

13 Claims, 27 Drawing Sheets

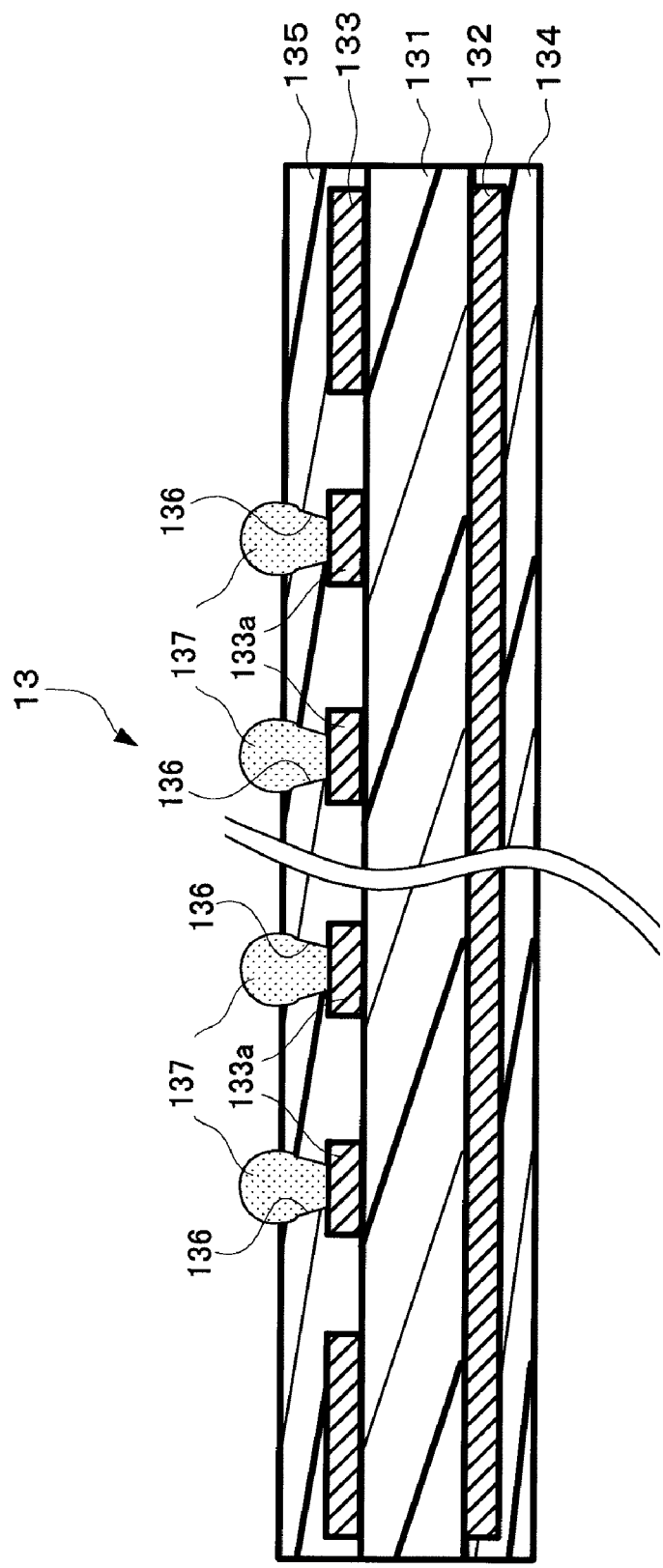

OPTO-ELECTRICAL HYBRID WIRING BOARD AND METHOD FOR MANUFACTURING THE SAME

CROSS-REFERENCE TO RELATED APPLICATIONS

The present application claims the benefits of priority to U.S. Application No. 61/149,035, filed Feb. 2, 2009. The contents of that application are incorporated herein by reference in their entirety.

BACKGROUND OF THE INVENTION

1. Field of the Invention

The present invention is related to an opto-electrical hybrid wiring board and its manufacturing method. The opto-electrical hybrid wiring board is formed with a flex-rigid wiring board and with a light-emitting element and a light-receiving element optically connected to each other by a flexible optical waveguide arranged on the flex-rigid wiring board.

2. Discussion of the Background

Conventionally, as for such types of opto-electrical hybrid wiring boards, for example, an opto-electrical hybrid wiring board described in U.S. Pat. No. 7,130,511B is known. The opto-electrical hybrid wiring board is formed basically with a flexible wiring board (FPC substrate) having joint connector portions on both ends, an optical waveguide, a light-emitting element and a light-receiving element. The light-emitting element and light-receiving element along with flexible optical waveguide are mounted on the flexible wiring board. The opto-electrical hybrid wiring board is mounted on a motherboard or the like through electrical connections by connecting the joint connector portions of the flexible wiring board and the connectors of the motherboard.
The contents of U.S. Pat. No. 7,130,511B are incorporated herein by reference in their entirety.

SUMMARY OF THE INVENTION

In an exemplary aspect, an opto-electrical hybrid wiring board is provided. The opto-electrical hybrid wiring board includes a flexible wiring board, a first rigid wiring board, a second rigid wiring board, a light-emitting element, a light-receiving element and a flexible optical waveguide. The first rigid wiring board and the second rigid wiring board are connected to each other by the flexible wiring board. At least one end of the flexible wiring board is inserted into and supported by either the first rigid wiring board or the second rigid wiring board. The first or the second rigid wiring board and the flexible wiring board are electrically connected to each other by a via that connects the wiring of the first or second rigid wiring board and the wiring of the flexible wiring board at portions of the flexible wiring board that are inserted into the first rigid wiring board or the second rigid wiring board. One of the light-emitting element and the light-receiving element is arranged on the first rigid wiring board and the other of the light-emitting element and the light-receiving element is arranged on the second rigid wiring board. The flexible optical waveguide is configured to optically connect the light-emitting element and the light-receiving element.

In another exemplary aspect, a method for manufacturing an opto-electrical hybrid wiring board is provided. The method includes aligning a flexible wiring board between a first rigid material and a second rigid material and forming insulation layers on both surfaces of the flexible wiring board, the first rigid material and the second rigid material. Part of the flexible wiring board is exposed between the first rigid material and the second rigid material. The method further includes arranging a light-emitting element on the insulation layer formed on the first rigid material, arranging a light-receiving element on the insulation layer formed on the second rigid material, and arranging a flexible optical waveguide, which optically connects the light-emitting element and the light-receiving element, on the exposed part of the flexible wiring board.

In another exemplary aspect, a method for manufacturing an opto-electrical hybrid wiring board is provided. The method includes fixing a light-emitting element and a light-receiving element to a flexible wiring board on which a flexible optical waveguide is formed for optically connecting the light-emitting element and the light-receiving element. The method further includes preparing a support material with an adhesive layer, aligning the flexible wiring board between a first rigid material and a second rigid material, and mounting the first rigid material, the second rigid material and the flexible wiring board on the adhesive layer of the support material. The flexible wiring board is fixed to the first rigid material and the second rigid material, and the support material is removed. Insulation layers are formed on both surfaces of the first rigid material, the second rigid material and the flexible wiring boar. Part of the flexible wiring board between the first rigid material and the second rigid material is exposed by removing part of the insulation layers.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

[FIG. 16A] a cross-sectional view showing a modified example of a flexible wiring board;

DETAILED DESCRIPTION OF THE EMBODIMENTS

Figure 1:
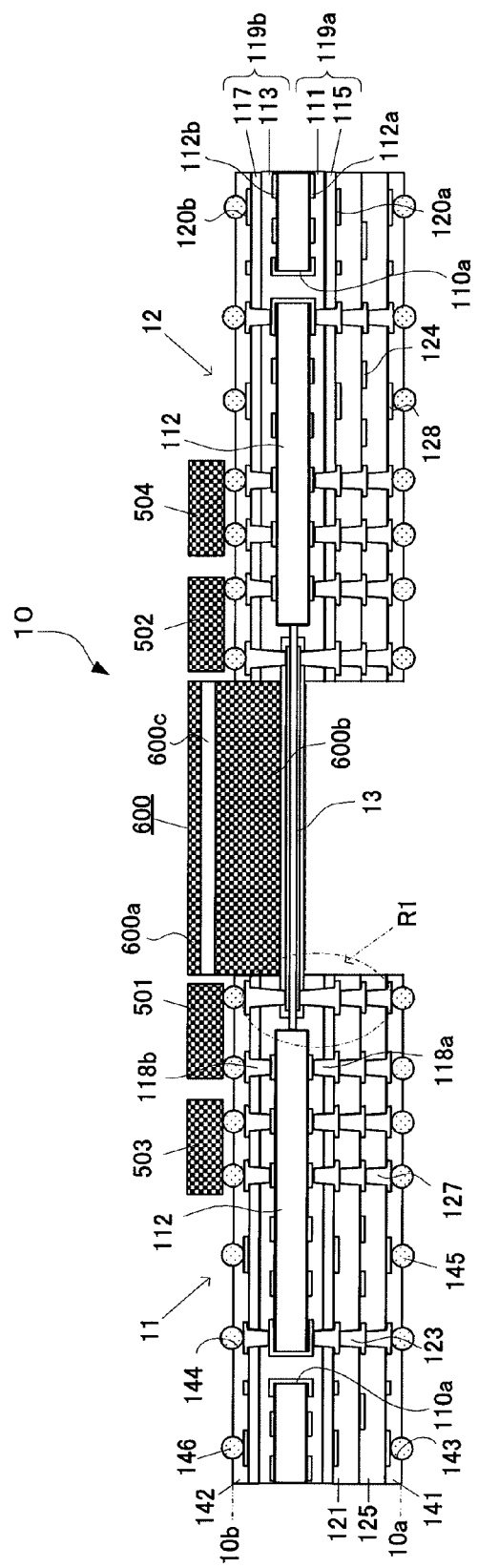
[FIG. 1] a cross-sectional view of an opto-electrical hybrid wiring board according to the First Example Embodiment of the present invention.
Figure 2:
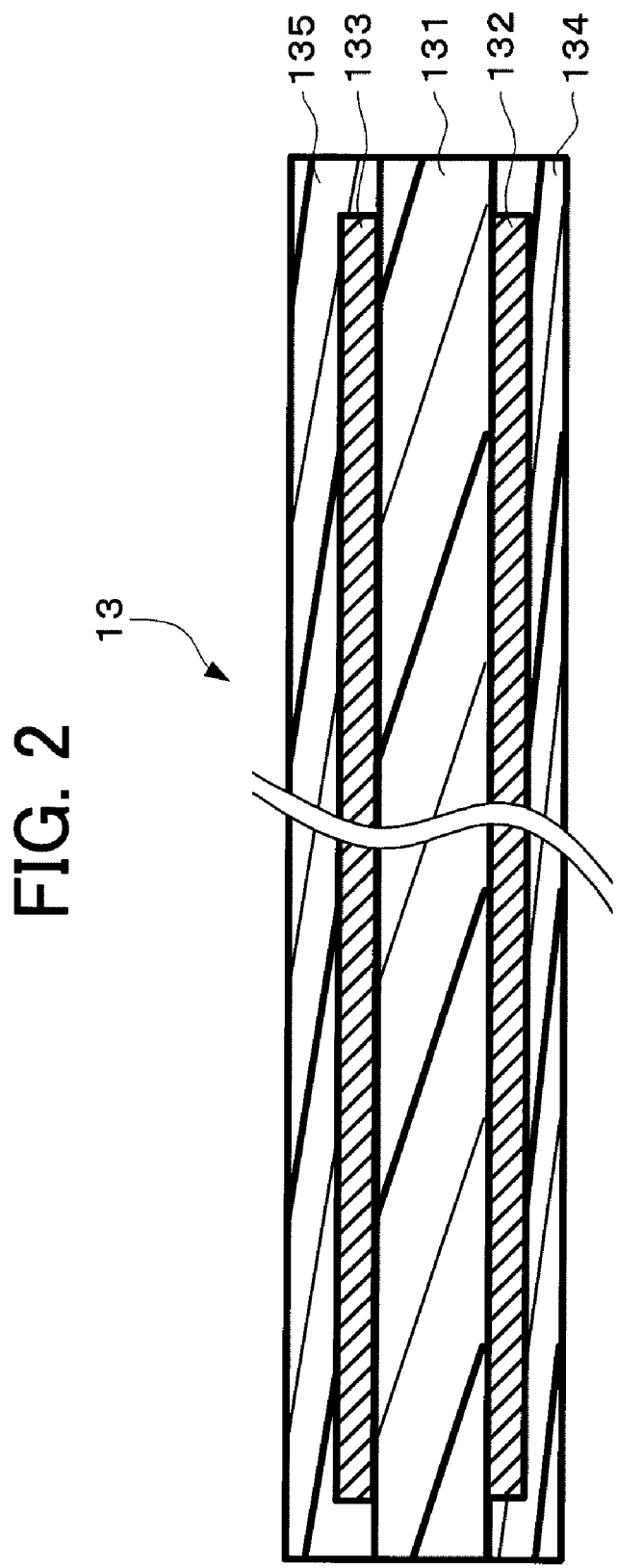
[FIG. 2] a cross-sectional view of a flexible wiring board.
Figure 3:
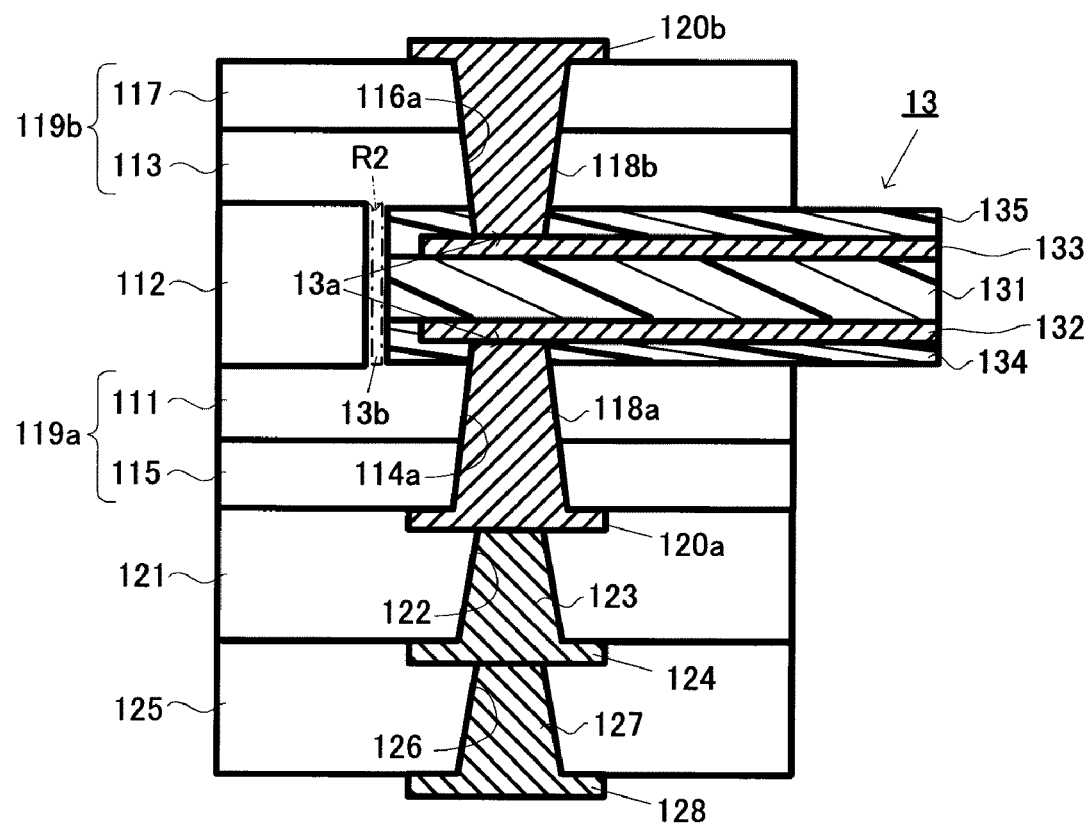
[FIG. 3] a partially magnified view of region (R1) shown in FIG. 1)
Figure 4A:
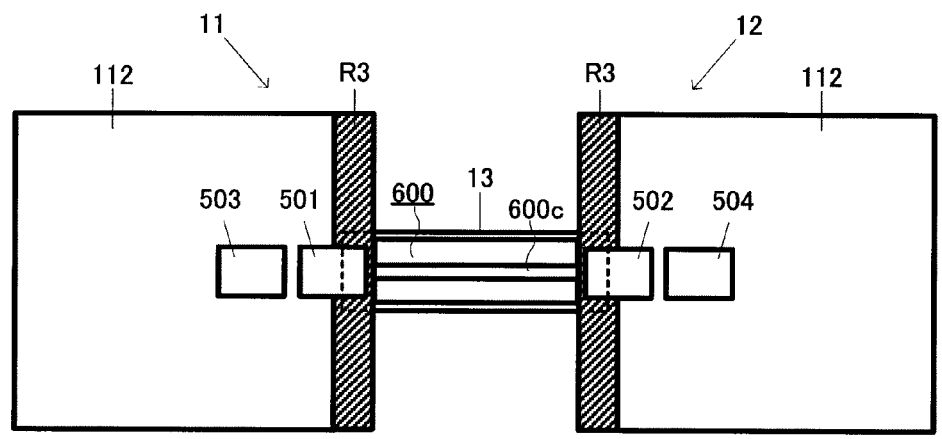
[FIG. 4A] a plan view of an opto-electrical hybrid wiring board.
Figure 4B:
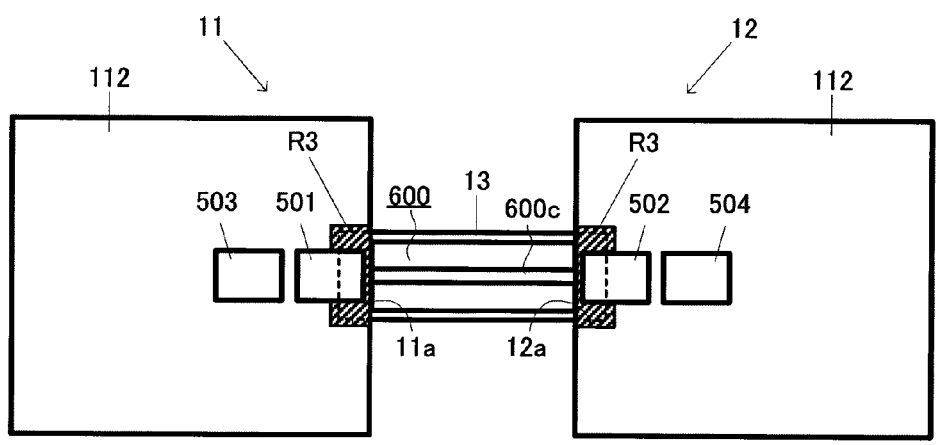
[FIG. 4B] a plan view of an opto-electrical hybrid wiring board.
Figure 5:
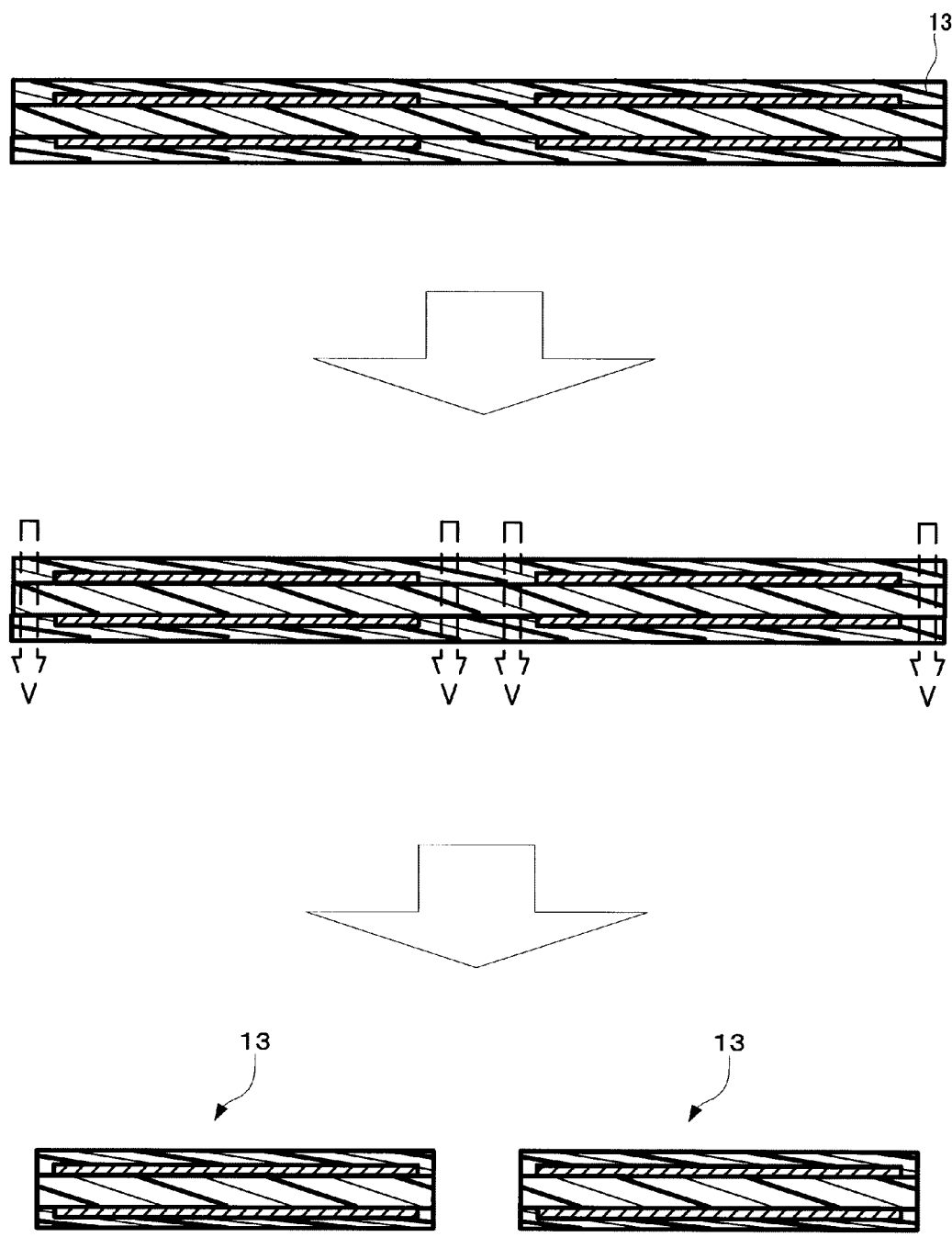
[FIG. 5] a view showing a process to cut out flexible wiring boards from a wafer commonly used for multiple products according to a method for manufacturing an opto-electrical hybrid wiring board of the First Example Embodiment of the present invention.
Figure 6:
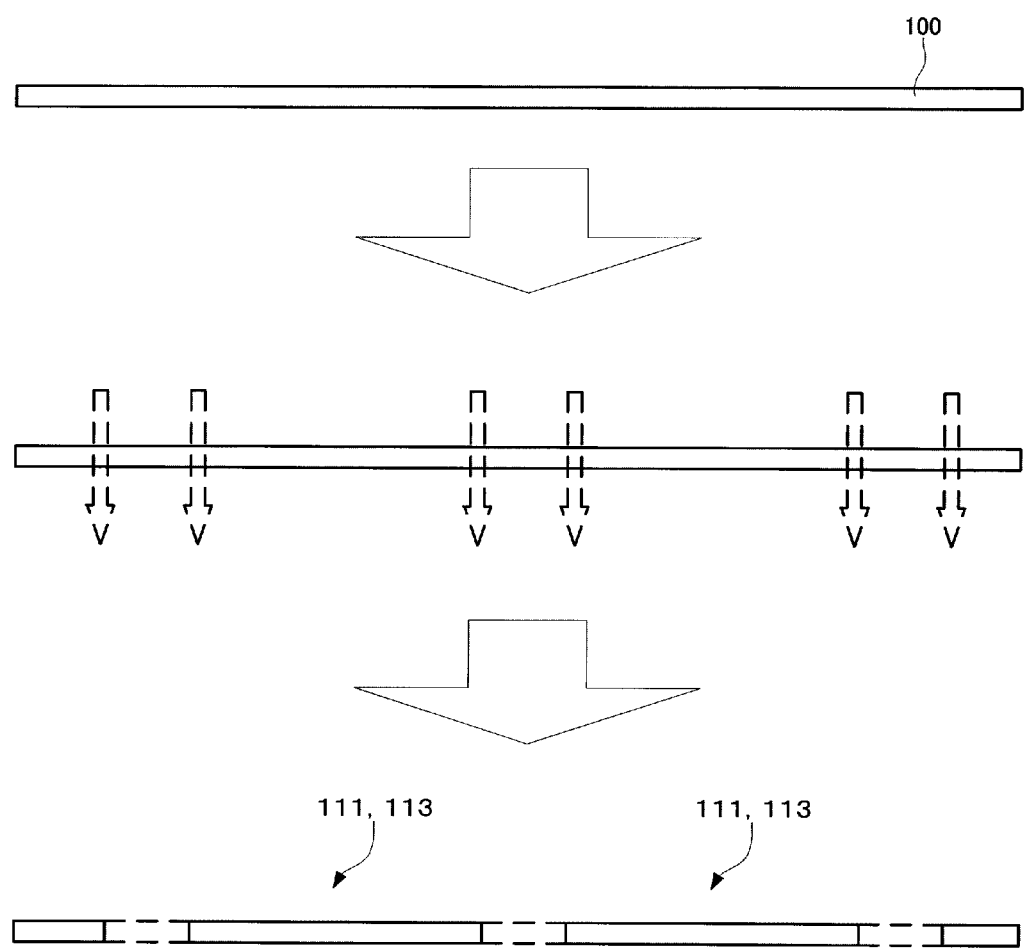
[FIG. 6] a view showing a process to cut out insulation layers from a wafer commonly used for multiple products.
Figure 7:
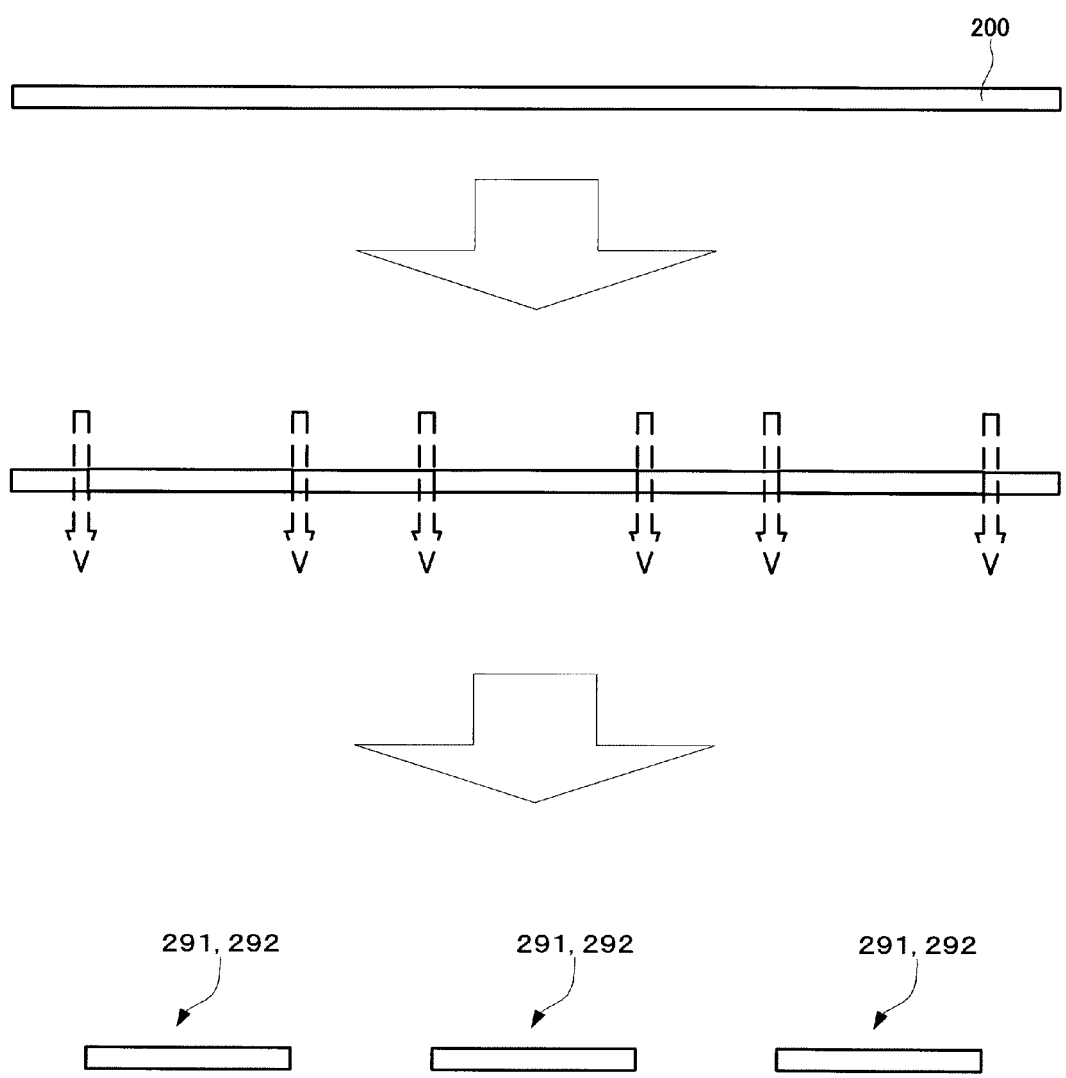
[FIG. 7] a view showing a process to cut out separators from a wafer commonly used for multiple products.
Figure 8A:
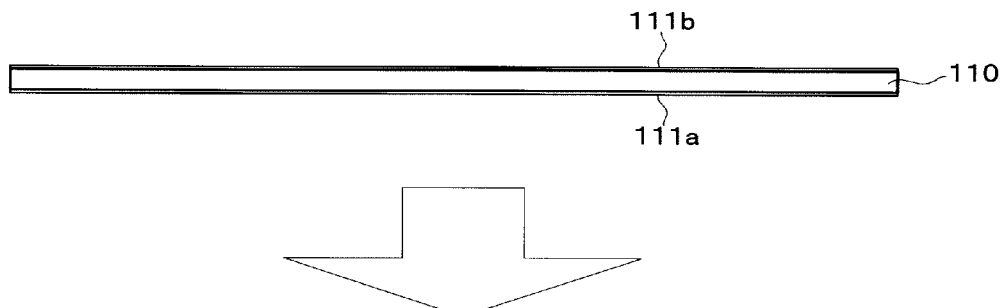
[FIG. 8A] a view showing a step to produce cores for rigid wiring boards.
Figure 8B:
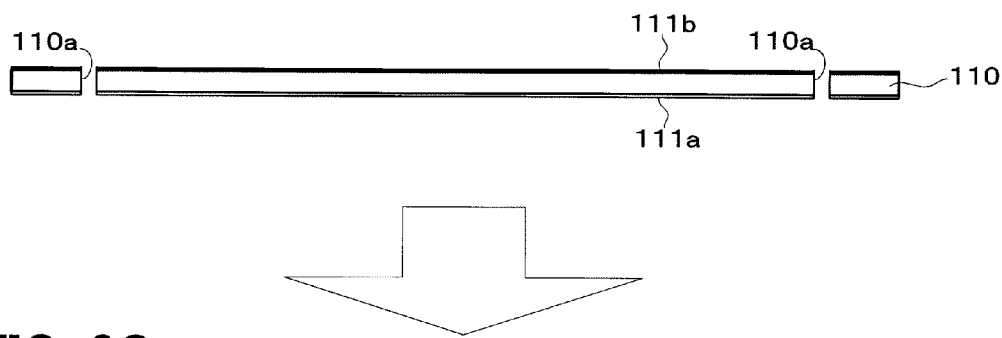
[FIG. 8B] a view showing a step to produce cores for rigid wiring boards.
Figure 8C:
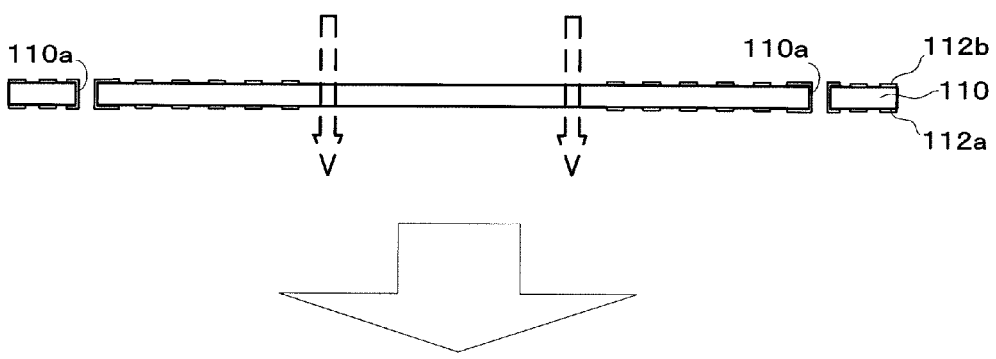
[FIG. 8C] a view showing a step to produce cores for rigid wiring boards.
Figure 8D:
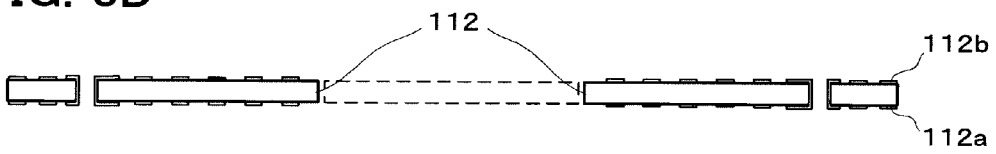
[FIG. 8D] a view showing a step to produce cores for rigid wiring boards.
Figure 9A:
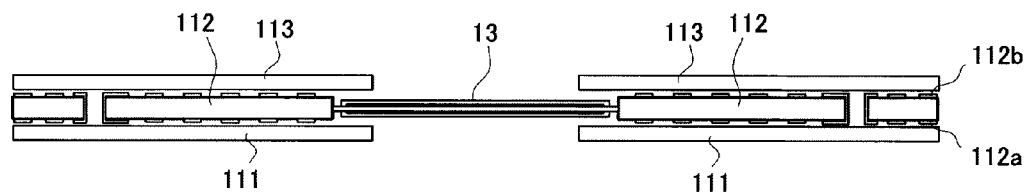
[FIG. 9A] a view showing a step of lamination on both sides of wiring boards.
Figure 9B:
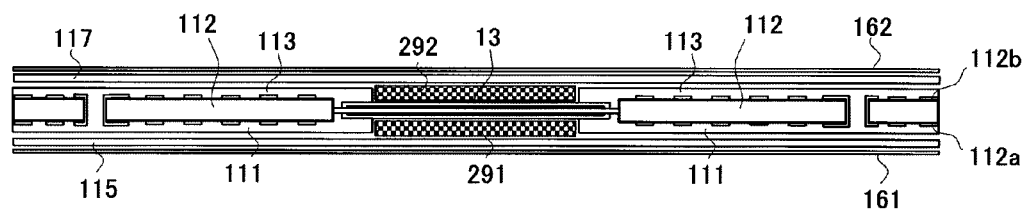
[FIG. 9B] a view showing a step of lamination on both sides of wiring boards.
Figure 9C:
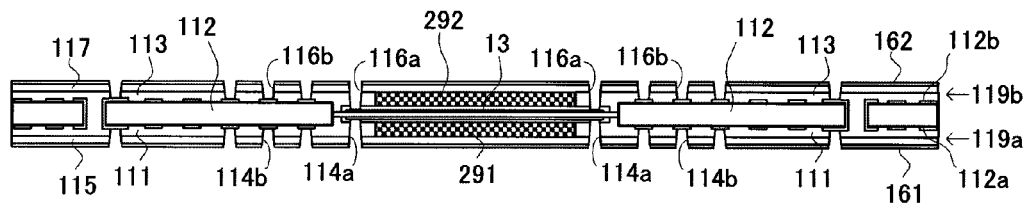
[FIG. 9C] a view showing a step of lamination on both sides of wiring boards.
Figure 9D:
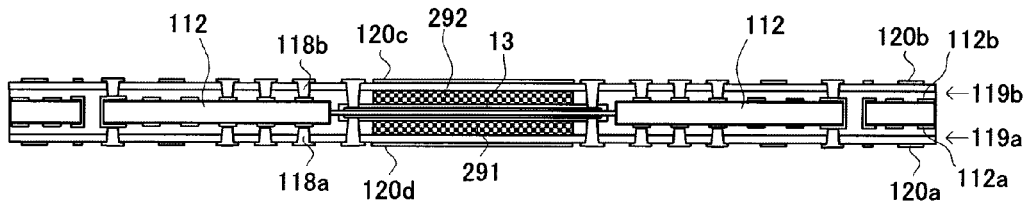
[FIG. 9D] a view showing a step of lamination on both sides of wiring boards.
Figure 10A:
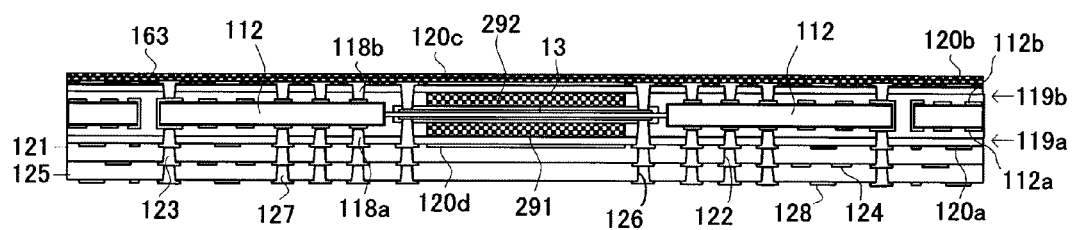
[FIG. 10A] a view showing a step of further lamination on one side of wiring boards.
Figure 10B:
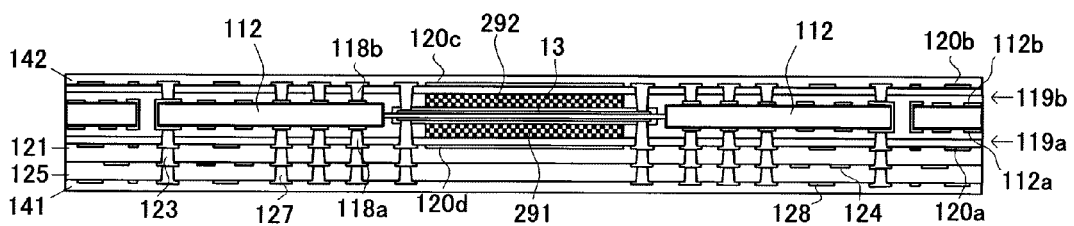
[FIG. 10B] a view showing a step of further lamination on one side of wiring boards.
Figure 11A:
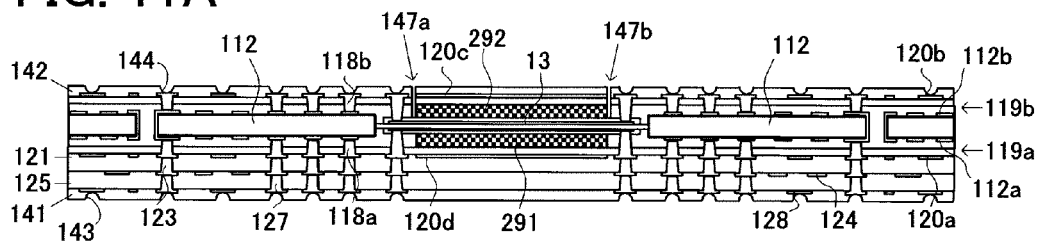
[FIG. 11A] a view showing a step to partially expose a flexible wiring board and to arrange optical components.
Figure 11B:
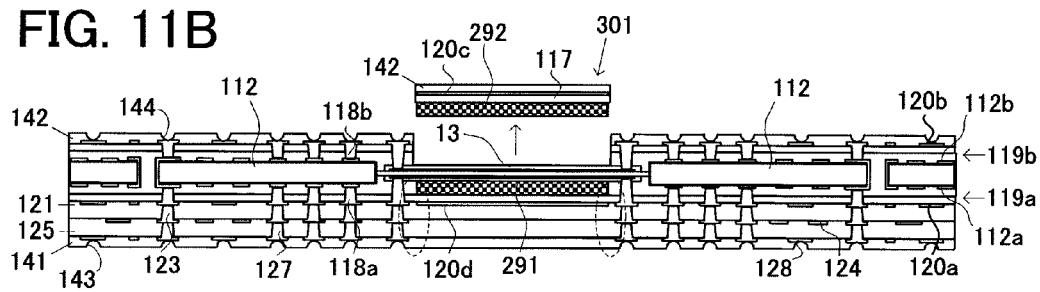
[FIG. 11B] a view showing a step to partially expose a flexible wiring board and to arrange optical components.
Figure 11C:
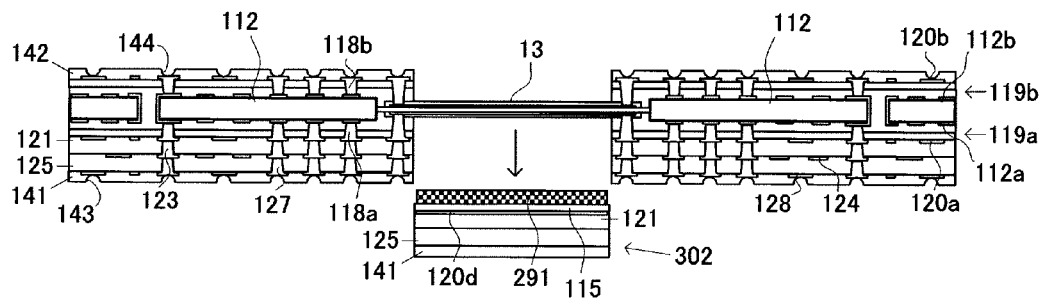
[FIG. 11C] a view showing a step to partially expose a flexible wiring board and to arrange optical components.
Figure 11D:
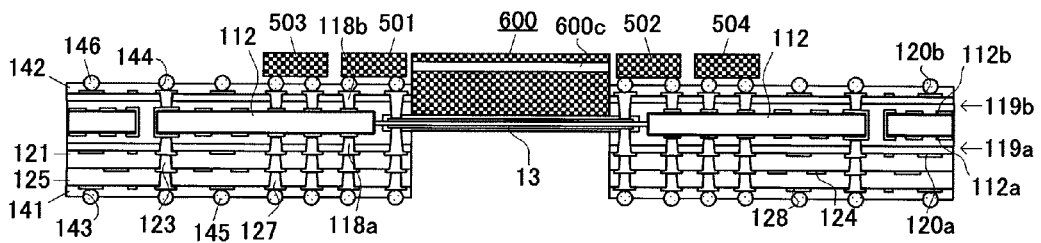
[FIG. 11D] a view showing a step to partially expose a flexible wiring board and to arrange optical components.
Figure 12:
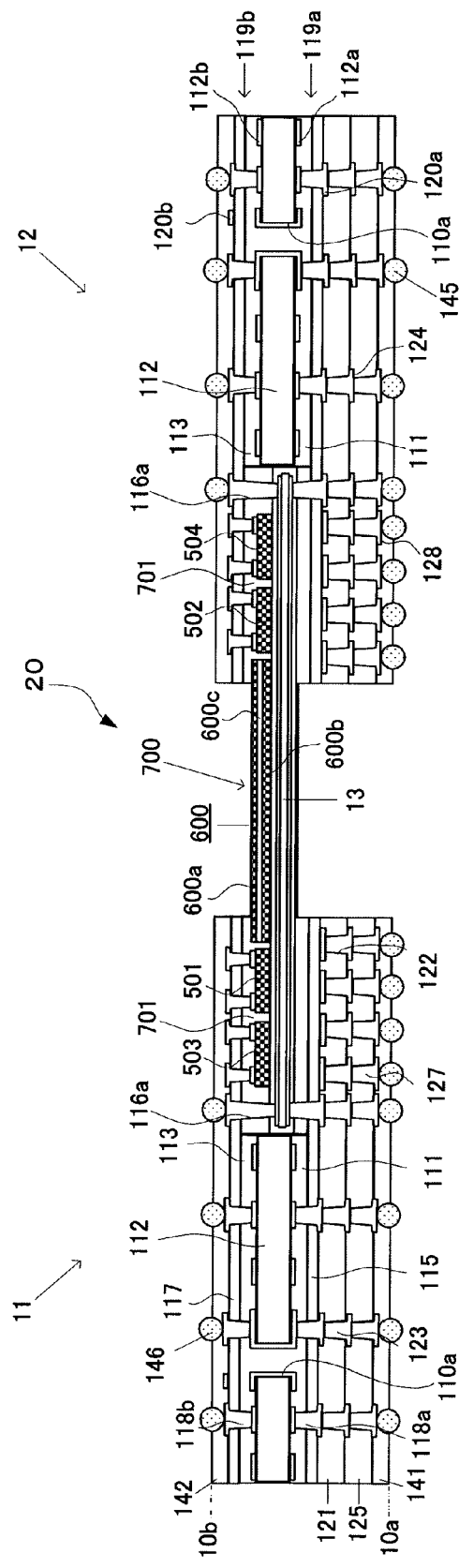
[FIG. 12] a cross-sectional view of an opto-electrical hybrid wiring board according to the Second Example Embodiment of the present invention.
Figure 13A:
[FIG. 13A] a view showing a step to arrange first and second rigid wiring materials and a flexible wiring board on an adhesive layer of a support material.
Figure 13B:
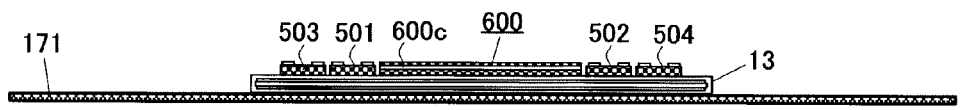
[FIG. 13B] a view showing a step to arrange first and second rigid wiring materials and a flexible wiring board on an adhesive layer of a support material.
Figure 13C:
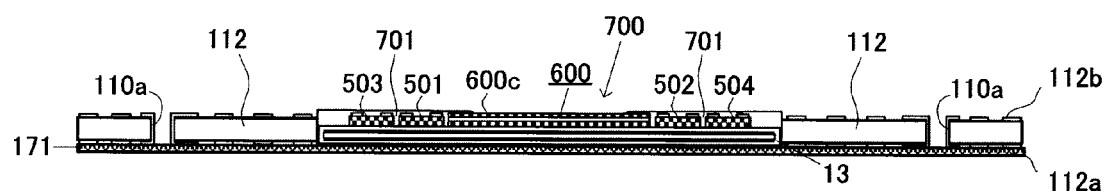
[FIG. 13C] a view showing a step to arrange first and second rigid wiring materials and a flexible wiring board on an adhesive layer of a support material.
Figure 14A:
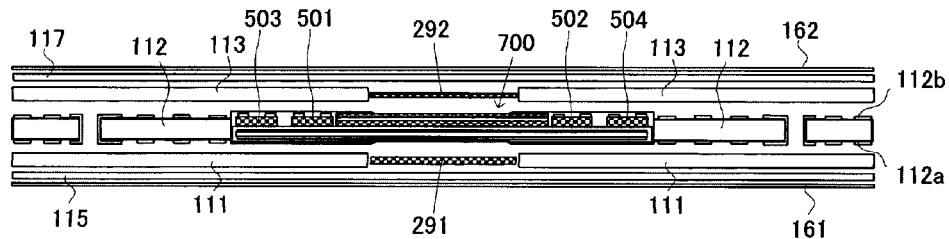
[FIG. 14A] a view showing a step of lamination on wiring boards.
Figure 14B:
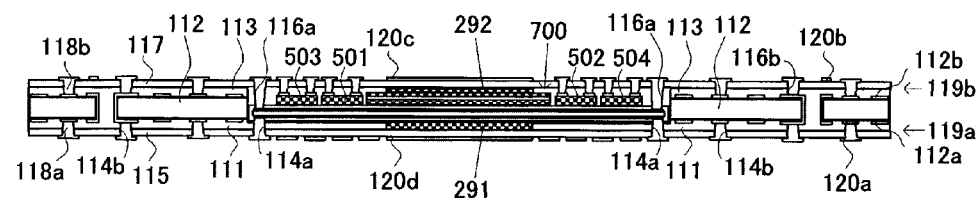
[FIG. 14B] a view showing a step of lamination on wiring boards.
Figure 14C:
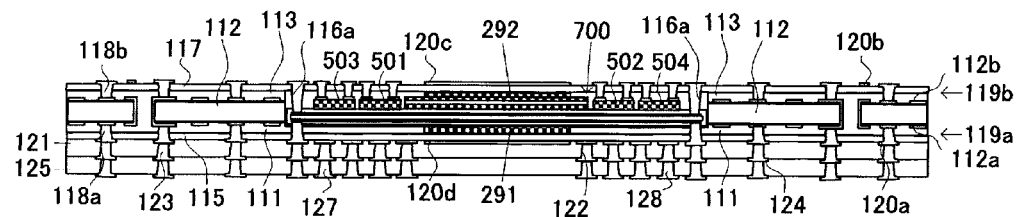
[FIG. 14C] a view showing a step of lamination on wiring boards.
Figure 14D:
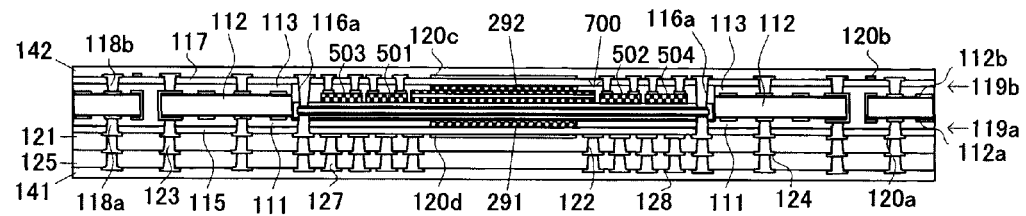
[FIG. 14D] a view showing a step of lamination on wiring boards.
Figure 15A:
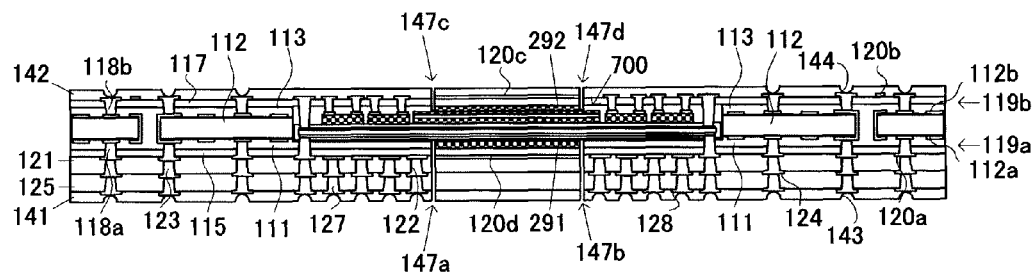
[FIG. 15A] a view showing a step to partially expose a laminate of a flexible optical waveguide and a flexible wiring board.
Figure 15B:
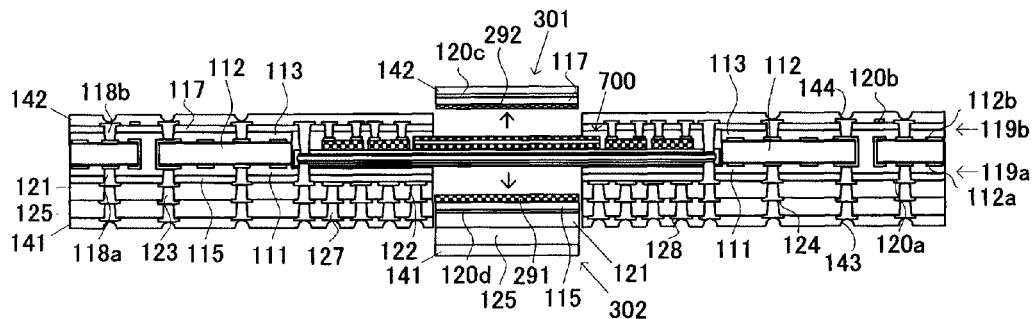
[FIG. 15B] a view showing a step to partially expose a laminate of a flexible optical waveguide and a flexible wiring board.
Figure 15C:
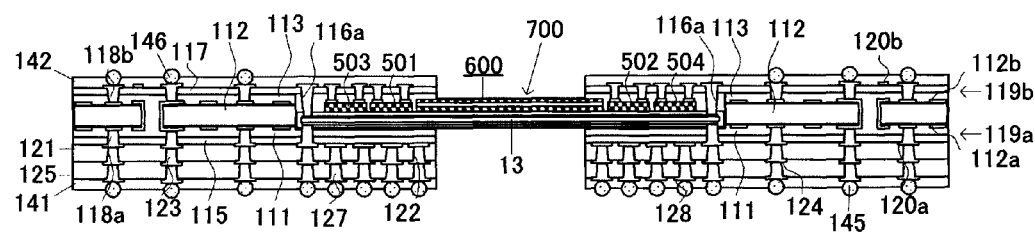
[FIG. 15C] a view showing a step to partially expose a laminate of a flexible optical waveguide and a flexible wiring board.
Figure 16B:
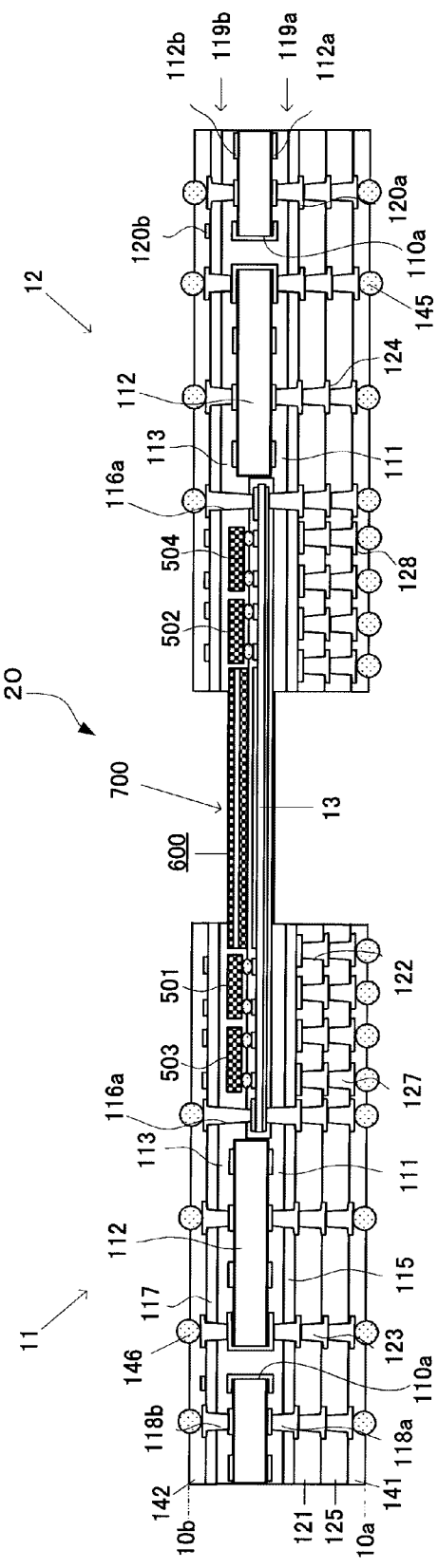
[FIG. 16B] a cross-sectional view showing a modified example of an opto-electrical hybrid wiring board.
Figure 17:
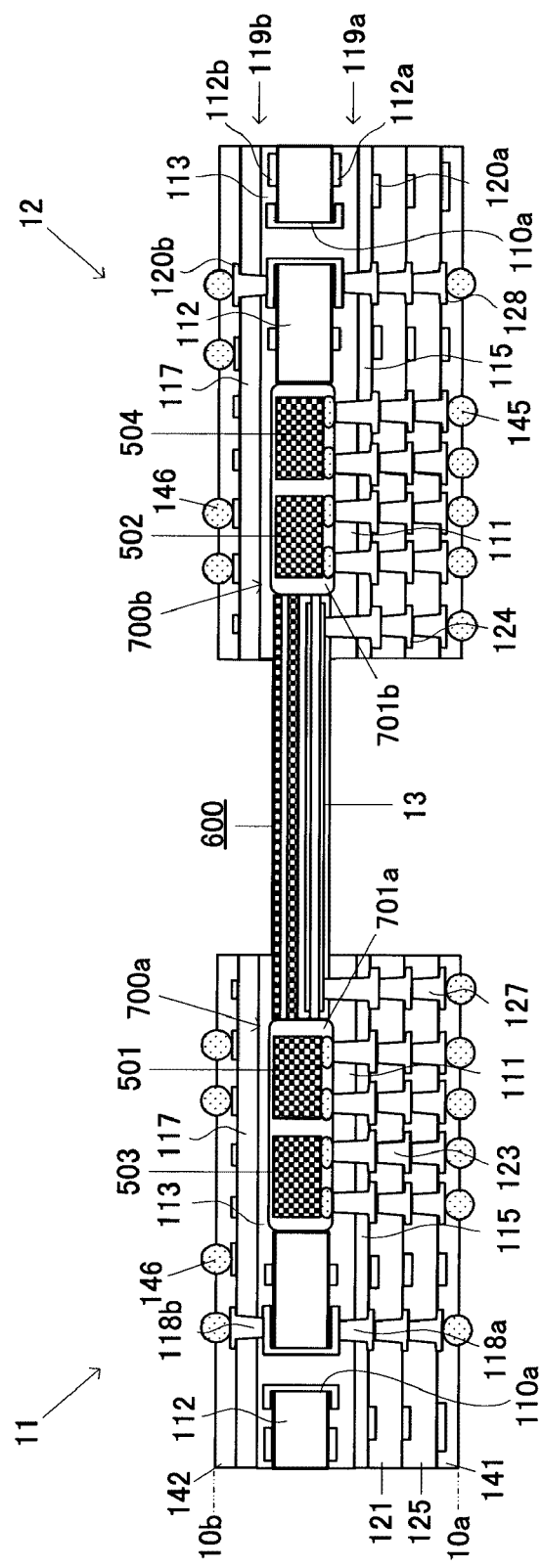
[FIG. 17] a cross-sectional view showing another modified example of an opto-electrical hybrid wiring board.
Figure 18:
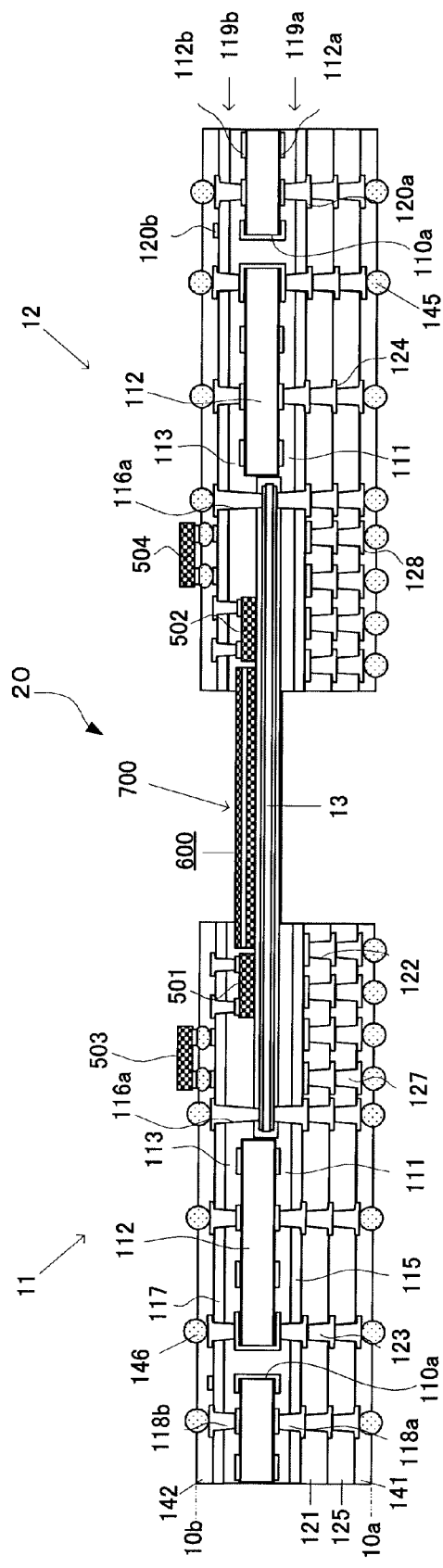
[FIG. 18] a cross-sectional view showing yet another modified example of an opto-electrical hybrid wiring board.
Figure 19:
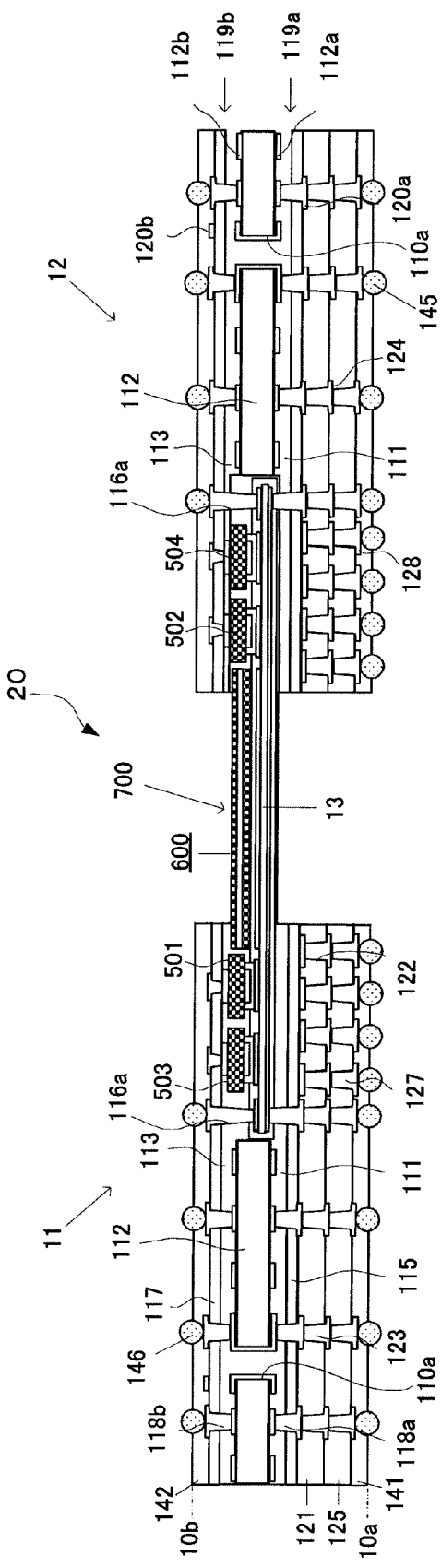
[FIG. 19] a cross-sectional view showing yet another modified example of an opto-electrical hybrid wiring board.
Figure 20A:
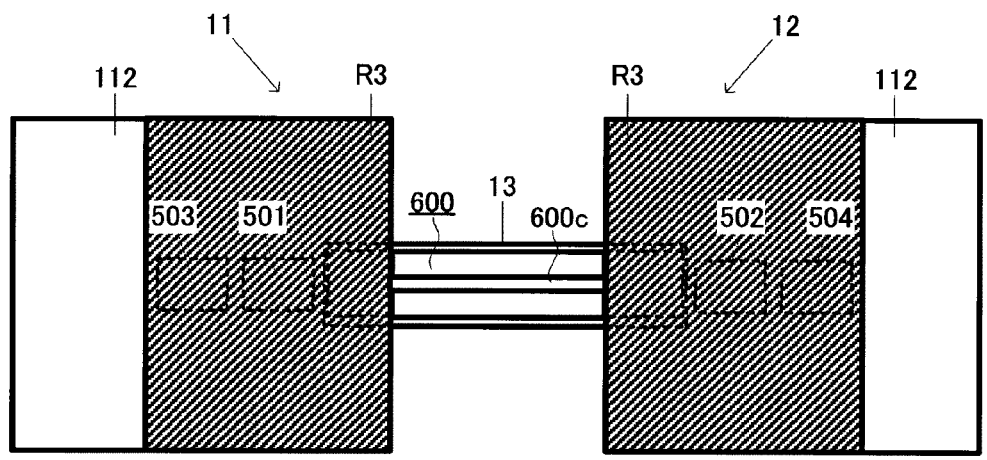
[FIG. 20A] a plan view showing yet another modified example of an opto-electrical hybrid wiring board.
Figure 20B:
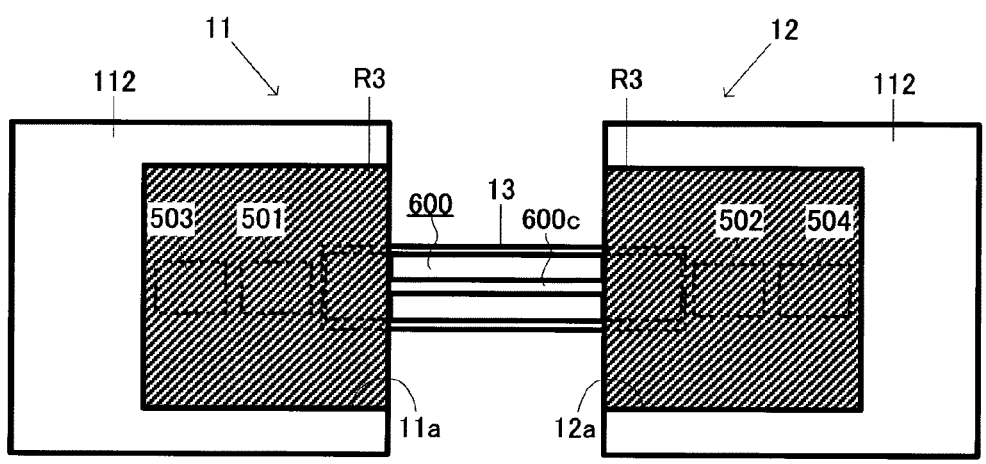
[FIG. 20B] a plan view showing yet another modified example of an opto-electrical hybrid wiring board.
Figure 21A:
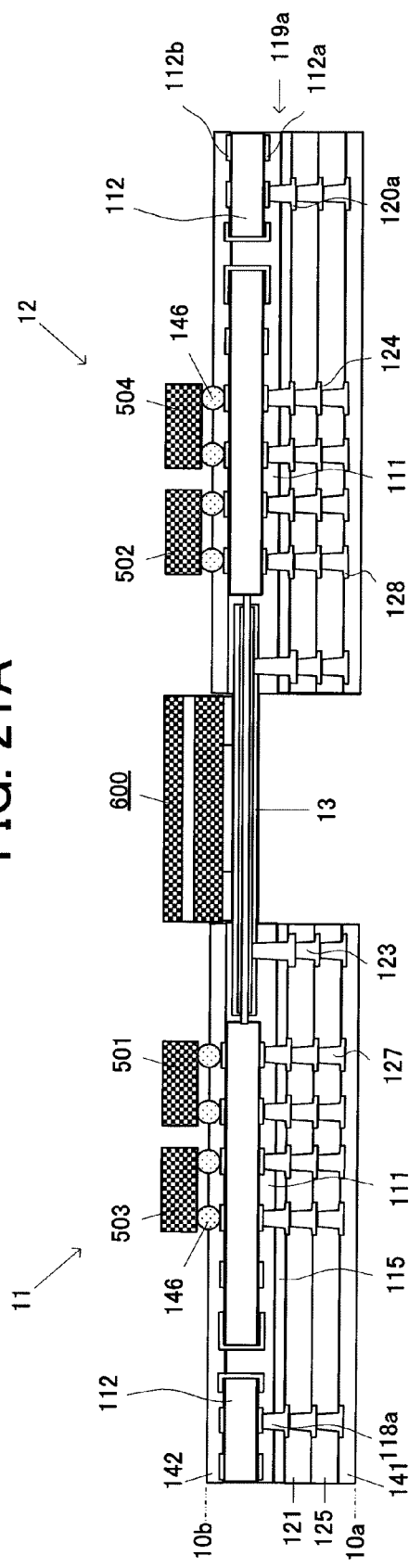
[FIG. 21A] a cross-sectional view showing an example of an opto-electrical hybrid wiring board in which upper-layer vias are omitted from the main surface.
Figure 21B:
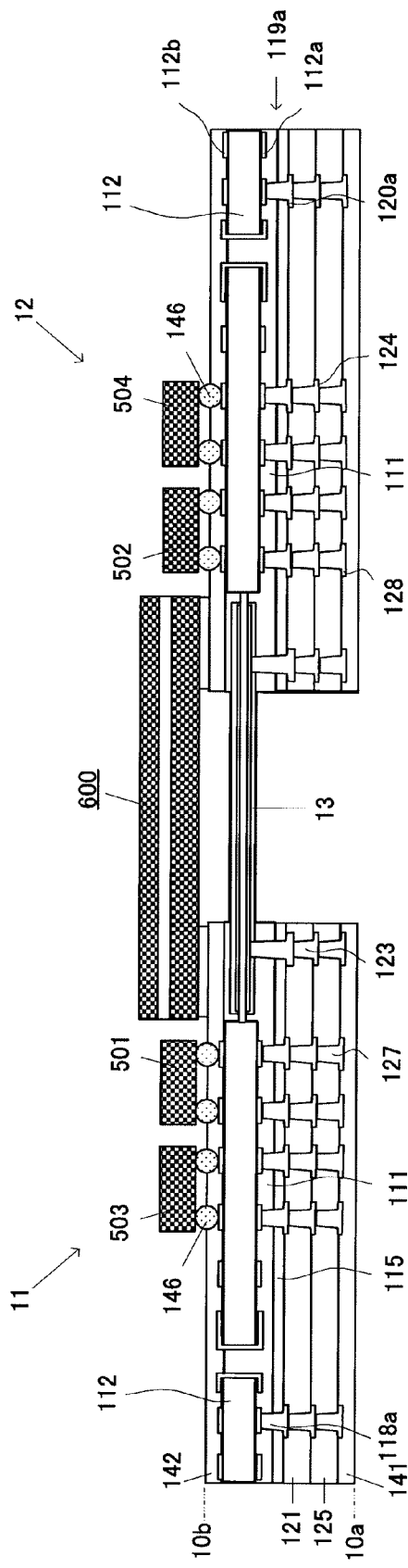
[FIG. 21B] a cross-sectional view showing an example of an opto-electrical hybrid wiring board in which a flexible optical waveguide is arranged on rigid wiring boards.
Figure 22:
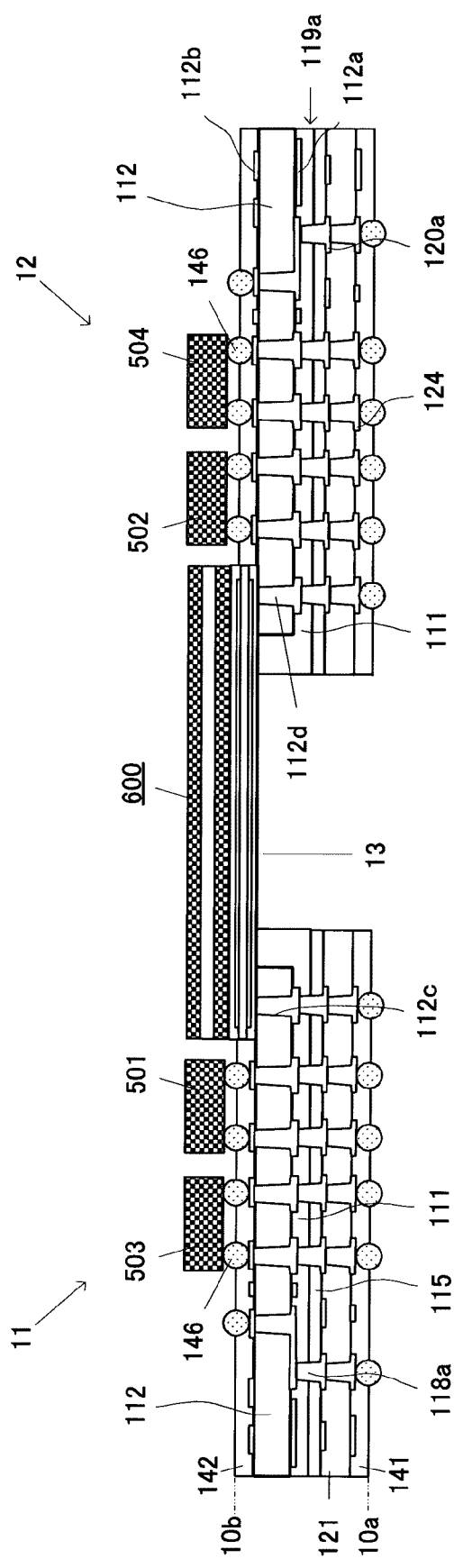
[FIG. 22] a cross-sectional view showing an example of an opto-electrical hybrid wiring board in which wiring of rigid wiring boards and wiring of a flexible wiring board are electrically connected by filled vias formed in core substrates.
Figure 23:
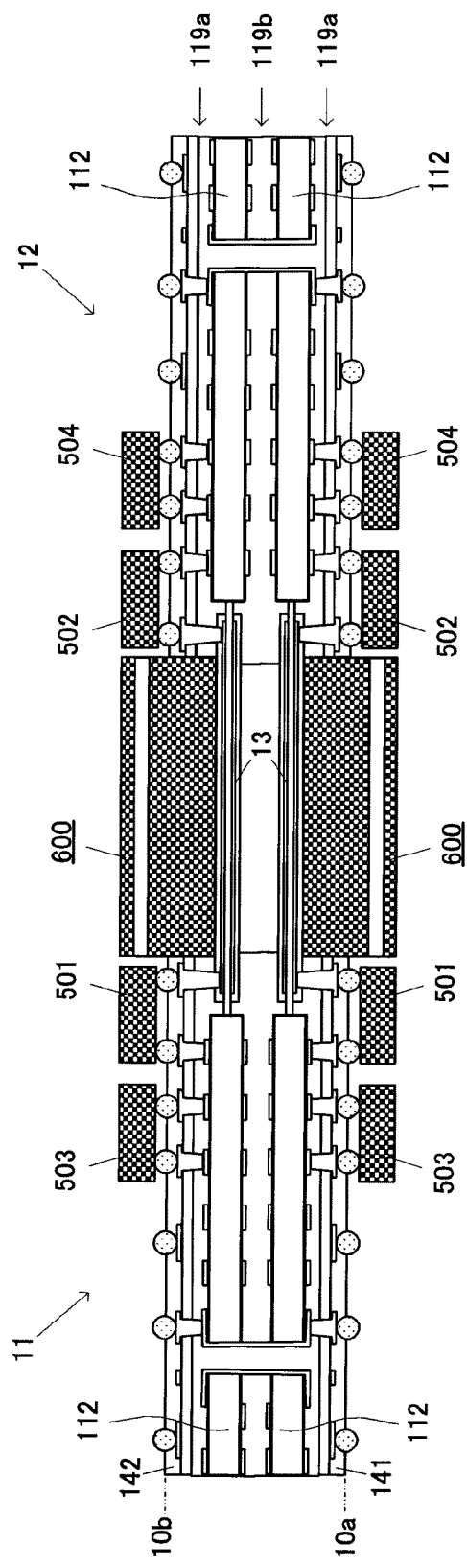
[FIG. 23] a cross-sectional view showing an example of an opto-electrical hybrid wiring board having two or more flexible wiring boards arranged by being shifted in the direction of the thickness of rigid wiring boards (vertically)
Figure 24A:
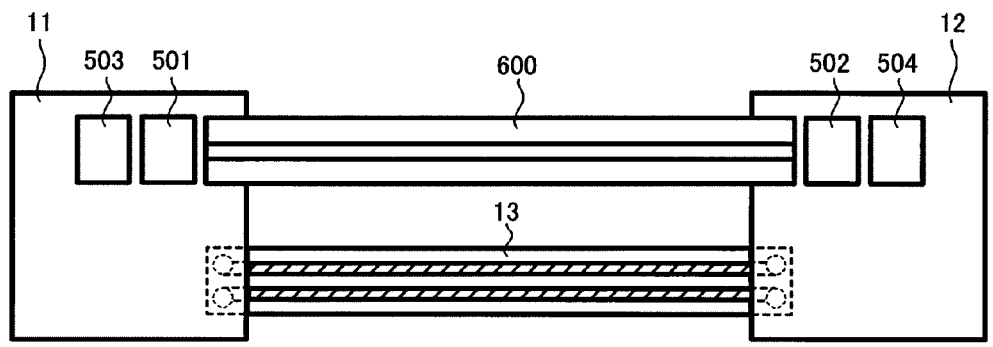
[FIG. 24A] a view showing an example of an opto-electrical hybrid wiring board in which a flexible wiring board and a flexible optical waveguide are arranged parallel to each other.
Figure 24B:
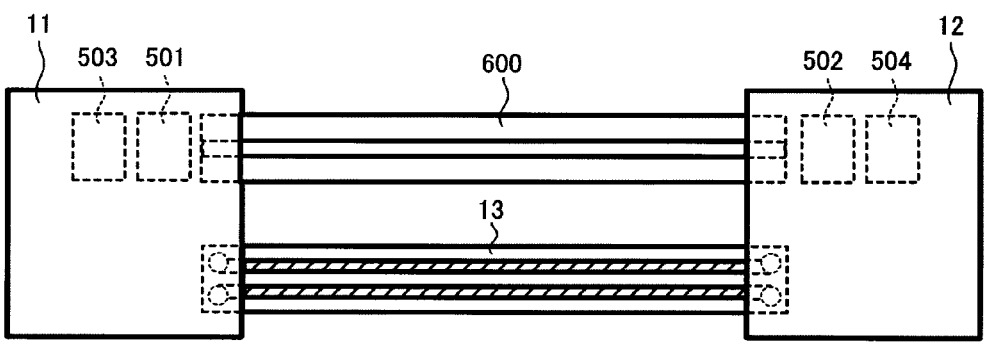
[FIG. 24B] a view showing an example of an opto-electrical hybrid wiring board in which a flexible wiring board and a flexible optical waveguide are arranged parallel to each other.
Figure 24C:
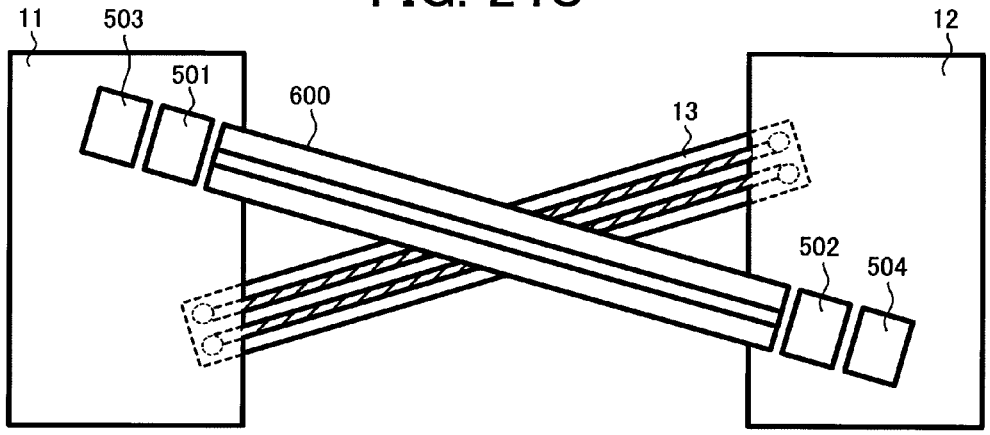
[FIG. 24C] a view showing an example of an opto-electrical hybrid wiring board in which a flexible wiring board and a flexible optical waveguide are arranged to cross each other.
Figure 25A:
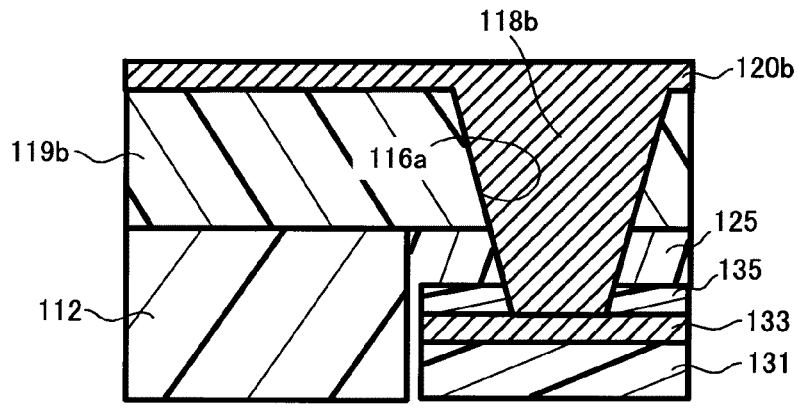
[FIG. 25A] a cross-sectional view showing a connection structure of a rigid wiring board and a flexible wiring board.
Figure 25B:
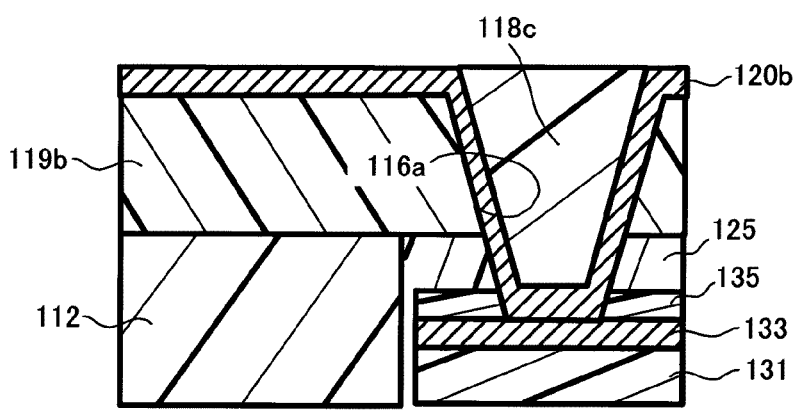
[FIG. 25B] a cross-sectional view showing a modified example of the connection structure of a rigid wiring board and a flexible wiring board.
Figure 25C:
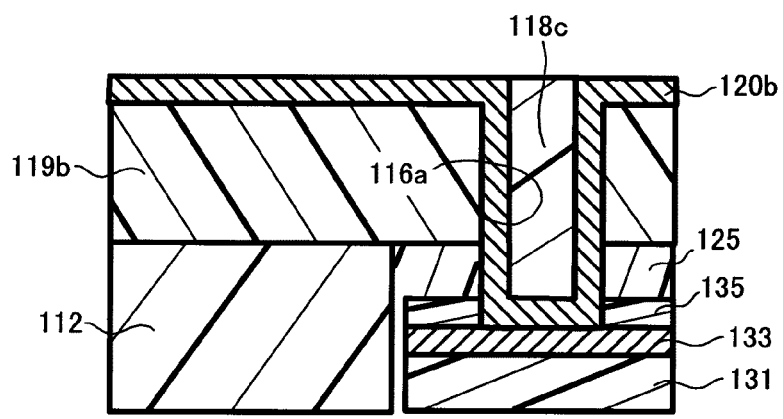
[FIG. 25C] a cross-sectional view showing another modified example of the connection structure of a rigid wiring board and a flexible wiring board.

The embodiments will now be described with reference to the accompanying drawings, wherein like reference numerals designate corresponding or identical elements throughout the various drawings.

If the joint connector portions of a flexible wiring board are connected to the connectors of a motherboard or the like, there is a concern that an increase of connection resistance or a faulty connection may occur at the connected portions. Thus, the need for improvement remains in view of connection reliability.

The present invention was carried out in consideration of such problems. Its objectives are to provide an opto-electrical hybrid wiring board with high reliability, especially with high connection reliability, and a method for manufacturing such a wiring board.

According to the present invention, an opto-electrical hybrid wiring board with high reliability, especially with high connection reliability, and a method for manufacturing such a wiring board may be provided.

Opto-electrical hybrid wiring board (10) and its manufacturing method according to the First Embodiment of the present invention are described.

Opto-electrical hybrid wiring board (10) is a so-called built-up multilayer printed wiring board. As its cross-sectional structure is shown in FIG. (1), it is formed basically with first rigid wiring board (11), second rigid wiring board (12), flexible wiring board (13) and various optical components (light-receiving element (501), light-emitting element (502), driver (503) of light-receiving element (501), amplifier (504) of light-emitting element (502) and flexible optical waveguide (600)) mounted on either first rigid wiring board (11) or second rigid wiring board (12). Here, first rigid wiring board (11) and second rigid wiring board (12) are arranged parallel facing each other with flexible wiring board (13) sandwiched in between. First rigid wiring board (11) and second rigid wiring board (12) are arranged horizontal to flexible wiring board (13). First and second wiring boards (11, 12) are so-called motherboards. Specifically, first and second wiring boards (11, 12) have sufficient size for mounting multiple electronic components, and have connection terminals for that purpose.

The above optical components are each arranged on the same surface (main surface (10b) of main surfaces (10a, 10b)) of opto-electrical hybrid wiring board (10). Flexible optical waveguide (600) is made up of upper clad (600a), lower clad (600b) and core layer (600c). Light-receiving element (501) and light-emitting element (502) are optically connected through core layer (600c). Also, by arranging the above optical components on the same surface (main surface (10b)), it will become easier to align light-receiving element (501), light-emitting element (502) and flexible optical waveguide (600). Flexible optical waveguide (600) is made of, for example, fluorinated polyimide resin. However, it is not limited to resin, but for example, flexible optical waveguide (600) may be made of fiber such as glass fiber.

As shown in FIG. (2) in detail, flexible wiring board (13) is formed by laminating base material (131), conductive layers (132, 133) and insulative films (134, 135).

Base material (131) is formed with an insulative flexible sheet, for example, a polyimide sheet with a thickness of 20-50 μm, preferably an approximate thickness of 30 μm. Conductive layers (133, 132) are formed respectively on the front and back surfaces of base material (131). Conductive layers (132, 133) are formed with, for example, a striped copper pattern with an approximate thickness of 5-15 μm. By means of conductive layers (132, 133), circuit patterns of first and second rigid wiring boards (11, 12) are electrically connected to each other.

On the other hand, as shown in FIG. (1), first and second rigid wiring boards (11, 12) are each formed basically with rigid base material (112), wiring layers and insulation layers laminated on front and back of rigid base material (112), and solder resists (141, 142) covering the front and back of the wiring boards respectively. Specifically, in first and second rigid wiring boards (11, 12), conductive pattern (112a), first insulation layer (119a), conductive pattern (120a), interlayer insulation layer (121), conductive pattern (124), interlayer insulation layer (125), conductive pattern (128) and solder resist (141) are laminated in that order on the side of main surface (10a) of rigid base material (112); and on the side of main surface (10b) of rigid base material (112), conductive pattern (112b), second insulation layer (119b), conductive pattern (120b) and solder resist (142) are laminated in that order.

Rigid base material (112) is made of rigid insulative material such as glass-epoxy resin, for example. In addition, the thickness of rigid base material (112) is set in the range of 50-150 μm, preferably about 100 μm. Rigid base material (112) corresponds to the core substrate of first and second rigid wiring boards (11, 12), and provides rigidity for first and second rigid wiring boards (11, 12). Also, on the front and back of rigid base material (112), conductive patterns (112b, 112a) made of copper are formed respectively. Such conductive patterns (112a, 112b) are electrically connected to further upper-layer conductors (wiring) at their respective predetermined spots. Also, through-holes (penetrating holes) (110a) are formed in rigid base material (112) to electrically connect conductive patterns (112a, 112b) formed on both of its surfaces.

Regarding first and second insulation layers (119a, 119b), first insulation layer (119a) is made up of insulation layer (111) and insulation layer (115); and second insulation layer (119b) is made up of insulation layer (113) and insulation layer (117). Here, insulation layers (111, 113, 115, 117) are made of, for example, prepreg containing inorganic fillers such as silica filler or glass filler. As for such prepreg, low-flow prepreg with low-flow characteristics is preferred to be used. Low-flow prepreg may be formed, for example, by impregnating glass cloth with epoxy resin and by thermosetting the resin to advance its curing degree beforehand. Alternatively, prepreg may be formed by impregnating glass cloth with highly viscous resin, or by impregnating glass cloth with resin containing inorganic filler (such as silica filler), or by reducing the amount of resin to be impregnated into glass cloth. First and second insulation layers (119a, 119b) each have a thickness in the range of 50-150 μm, preferably approximately 50 μm.

First and second rigid wiring boards (11, 12) and flexible wiring board (13) are connected at areas of the core substrate (rigid base material (112)) of first and second rigid wiring boards (11, 12). Specifically, first and second insulation layers (119a, 119b) formed on both surfaces of rigid base material (112) support and secure both ends of flexible wiring board (13) by sandwiching the respective ends. FIG. (3) is a magnified view of region (R1) (bonding portion of first rigid wiring board (11) and flexible wiring board (13)) in FIG. (1). The bonding portion of second rigid wiring board (12) and flexible wiring board (13) is formed in the same way as the bonding portion of first rigid wiring board (11) and flexible wiring board (13). Thus, only the structure (FIG. (3)) of the bonding portion of first rigid wiring board (11) and flexible wiring board (13) is described in detail, and a detailed description of the other bonding portion is omitted here.

As shown in FIG. (3), flexible wiring board (13) is arranged horizontally between rigid base material (112) of first rigid wiring board (11) and rigid base material (112) of second rigid wiring board (12). At the bonding portion of first rigid wiring board (11) and flexible wiring board (13), first and second insulation layers (119a, 119b) cover substantially the entire rigid base material (112) and an end portion of flexible wiring board (13) from front and back respectively, while exposing part (the central portion) of flexible wiring board (13).

As FIG. (4A) shows in a plan view of opto-electrical hybrid wiring board (10), rigid base material (112) is not located in region (R3) where first and second insulation layers (119a, 119b) sandwich flexible wiring board (13). Namely, in first and second rigid wiring boards (11, 12), portions of rigid base materials (112) are removed from regions (R3), thus making rigid base materials (112) smaller than first and second rigid wiring boards (11, 12) respectively. In an example shown in FIG. (4A), regions (R3) cover the entire area in the direction of the width of first and second rigid wiring boards (11, 12) respectively (a direction perpendicular to the direction in which the rigid wiring boards are connected). However, the position and configuration of regions (R3) are not limited to such, and any other options are possible. For example, as shown in FIG. (4B), by selectively removing the portions to which flexible wiring board (13) is inserted, concave portions (11a, 12a) are formed, and they then become regions (R3).

The space compartmentalized by rigid base material (112), flexible wiring board (13) and insulation layers (111, 113) (space (R2) among such members), resin (13b) is filled as shown in FIG. (3). Resin (13b) is what is drained from the low-flow prepreg that forms insulation layers (111, 113) during the manufacturing process, and is cured to become integrated with insulation layers (111, 113).

In first and second insulation layers (119a, 119b), vias (contact holes) (114a, 116a) are formed in portions that face their respective connection pads (13a) of conductive layers (132, 133) in flexible wiring board (13). Vias (114a, 116a) penetrate insulative films (134, 135) of flexible wiring board

(13) respectively and expose pads (13a) made respectively from conductive layers (132, 133).

Vias (114a, 116a) are filled with conductors (118a, 118b) made of copper, for example, and conductors (118a, 118b) are connected to their respective connection pads (113a) of conductive layers (132, 133). Furthermore, on each surface of first and second insulation layers (119a, 119b), conductive patterns (120a, 120b) (wiring) electrically connected to conductors (118a, 118b) are formed respectively. Such conductive patterns (120a, 120b) are made of copper-plated layer, for example.

On the side of main surface (10a) of opto-electrical hybrid wiring board (FIG. (1)), further upper-layer wiring (conductive patterns (124, 128)) are formed. Namely, on insulation layer (115) and conductive pattern (120a) formed on its top, interlayer insulation layer (121) is further formed. Then, vias (122) connected to conductive pattern (120a) are formed in interlayer insulation layer (121), and are filled with conductor (123) made of copper, for example. On the surface of interlayer insulation layer (121), conductive pattern (124) is formed to be electrically connected to conductors (123). Also, interlayer insulation layer (125) is further formed on the above. Then, vias (126) connected to conductive pattern (124) are formed in interlayer insulation layer (125) and are filled with conductor (127) made of copper, for example. On the surface of interlayer insulation layer (125), conductive pattern (128) is formed to be electrically connected to conductors (127). As such, on the side of main surface (10b) of rigid base material (112), two layers of wiring (conductive patterns (112b, 120b)) are formed to be electrically connected to each other at predetermined spots; and on the side of main surface (10a) of rigid base material (112), four layers of wiring (conductive patterns (112a, 120a, 124, 128)) are formed to be electrically connected to each other at predetermined spots.

As described, in opto-electrical hybrid wiring board (10) of the present embodiment, flexible wiring board (13) is inserted (embedded) in first and second rigid wiring boards (11, 12) respectively, and in the inserted (embedded) areas, flexible wiring board (13) is electrically connected to each rigid wiring board (see FIG. (3)). Since first and second rigid wiring boards (11, 12) and flexible wiring board (13) are electrically connected through vias without using connectors, if impact from being dropped or the like is received, faulty connections caused by disconnected connectors will not occur. In addition, connection resistance may be reduced compared with connector connections. As a result, noise or transmission delays may also be reduced.

Also, since portions of flexible wiring board (13) are embedded in first and second rigid wiring boards (11, 12), both front and back surfaces of the portions of flexible wiring board (13), which are electrically connected to first and second rigid wiring boards (11, 12), are adhered to and reinforced by first and second rigid wiring boards (11, 12). Accordingly, when opto-electrical hybrid wiring board (10) receives impact from being dropped, or when the ambient temperature changes, and stress is generated due to a difference in coefficients of thermal expansion (CTE) between first and second rigid wiring boards (11, 12) and flexible wiring board (13), it is possible to maintain electrical connection between flexible wiring board (13) and first and second rigid wiring boards (11, 12).

Namely, opto-electrical hybrid wiring board (10) features electrical connections of higher reliability than substrates making connector connections.

Also, since first and second rigid wiring boards (11, 12) are connected by flexible wiring board (13), connectors and other devices are not required. Accordingly, manufacturing costs and other costs can be reduced.

Also, by embedding end portions of flexible wiring board (13) in first and second rigid wiring boards (11, 12), without making fundamental changes in the design of first and second rigid wiring boards (11, 12), electrical connection between first and second rigid wiring boards (11, 12) may be achieved. Moreover, since the electrical connection is made inside the wiring board, a larger mounting area is ensured on the surface of the wiring board compared with connector connections made on the surface of a wiring board. Thus, more electronic components may be mounted.

Also, conductive layers (132, 133) of flexible wiring board (13) and conductive patterns (wiring patterns) (120a, 120b) of first and second wiring boards (11, 12) are connected by filled vias in a tapered configuration. Thus, the areas which receive impact from being dropped or the like are the entire vias, and cracks seldom occur compared with through-hole connections or conformal via connections.

As shown in FIG. (1), on the front and back of opto-electrical hybrid wiring board (10), a predetermined number of holes (143, 144) are formed in predetermined spots of solder resists (141, 142); and pads (bumps) (145, 146) made of, for example, conductive material such as gold, are formed in their respective holes (143, 144). Among the above-described various optical components, light-receiving element (501) and its driver (503) are mounted on pads (146) on main surface (10b) of first rigid wiring board (11); and light-emitting element (502) and its amplifier (504) are mounted on pads (146) on main surface (10b) of second rigid wiring board (12). In addition, flexible optical waveguide (600) is positioned between light-receiving element (501) and light-emitting element (502), and is fixed onto flexible wiring board (13) (on the side of main surface (10b)) using an adhesive agent or the like.

On main surface (10b) of opto-electrical hybrid wiring board (10), light-receiving element (501) is located closer to second rigid wiring board (12) than driver (503) is; and light-emitting element (502) is located closer to first rigid wiring board (11) than amplifier (504) is. Thus, light-receiving element (501) and light-emitting element (502) face each other with flexible optical waveguide (600) in between. Flexible optical waveguide (600) has core layer (600c) between light-receiving element (501) and light-emitting element (502), and optically connects light-receiving element (501) and light-emitting element (502). Namely, driven by amplifier (504), light-emitting element (502) emits laser beams, and the beams emitted from light-emitting element (502) pass through core layer (600c) and are received by light-receiving element (501). Then, at light-receiving element (501), electrical signals are produced (opto-electrical transformation) according to a predetermined parameter (such as light amount) of the received beams. Then, the electrical signals will be amplified by driver (503). First and second rigid wiring boards (11, 12) and flexible wiring board (13) handle communication among the optical components, while also handling communication or the like between optical components and other electronic components (operation circuits such as CPU or the like, signal processing circuits and so forth) connected to either first rigid wiring board (11) or second rigid wiring board (12). In addition, pads (145) are used for mounting other electronic components on opto-electrical hybrid wiring board (10), or mounting opto-electrical hybrid wiring board (10) on another board, and so forth.

Since interlayer insulation layers are not formed in the central portion of flexible wiring board (13), flexible wiring board (13) may be bent along with flexible optical waveguide (600) toward its front or back (the direction of lamination). Such a feature is useful when opto-electrical hybrid wiring board (10) is arranged in a small space.

When manufacturing opto-electrical hybrid wiring board (10), flexible wiring board (13) is formed first. Specifically, copper film is formed on both surfaces of base material (131) made of polyimide with a predetermined size. Then, conductive layers (132, 133) are formed by patterning the copper film. After that, on the surface of conductive layers (132, 133), insulative films (134, 135) made of polyimide are formed respectively through a lamination process.

After processing such a series of steps, flexible wiring board (13) with a laminated structure is completed as previously shown in FIG. (2). Then, as shown in FIG. (5), flexible wiring board (13) is cut by a laser or the like to a predetermined size and configuration. Accordingly, flexible wiring board (13) with a predetermined size and configuration is obtained.

Next, flexible wiring board (13) manufactured as above and first and second rigid wiring boards (11, 12) are bonded respectively. Before bonding flexible wiring board (13) and first and second rigid wiring boards (11, 12), as shown in FIG. (6), for example, insulation layers (111, 113) with a predetermined size are prepared by cutting with a laser or the like insulative material (100) commonly used for multiple products. Also, as shown in FIG. (7), for example, separators (291, 292) with a predetermined size are prepared by cutting with a laser or the like separator sheet (200) commonly used for multiple products. Separators (291, 292) are formed with cured prepreg, polyimide film or the like. The thicknesses of separators (291, 292) are set approximately the same as those of insulation layers (111, 113) respectively.

In addition, rigid base material (112) is formed to be a core for first and second rigid wiring boards (11, 12). As shown in FIG. (8A), for example, a double-sided copper-clad laminate is prepared which is made by laminating copper foils (111b, 111a) with a thickness of 18 μm on both surfaces (front and back) of plate (110) made of rigid insulative material such as glass-epoxy resin. Then, as shown in FIG. (8B), using a drill or a laser, for example, through-holes (110a) are formed (drilled) at predetermined spots. In the following, as shown in FIG. (8C), by copper plating (electroless plating or electrolytic plating), for example, copper film is further formed on copper foils (111a, 111b) to thicken each copper film. After that, through a predetermined lithography process (preliminary treatment, laminating, exposing and developing, etching, removing the film, inner-layer inspection and so forth), for example, each copper film is patterned. Accordingly, conductive patterns (112a, 112b) are obtained. In the following, as shown in FIG. (8D), by removing a predetermined portion of the wafer using a laser, for example, rigid base materials (112) are obtained having conductive patterns (112b, 112a) on their front and back. After that, the surfaces of the conductive patterns of rigid base materials (112) manufactured as such are treated to make them roughened.

Next, insulation layers (111, 113), rigid base materials (112), and flexible wiring board (13) which are cut in the steps shown in FIGS. (5), (6), (8A)-(8D) are aligned and arranged as shown in FIG. (9A), for example. At that time, they are aligned so that each end portion of flexible wiring board (13) is inserted between insulation layers (111, 113).

In the following, such a structure is pressure-pressed while being aligned as above. During that time, resin (13b) is squeezed out from each prepreg that forms insulation layers (111, 113). As shown previously in FIG. (3), space (R2) between rigid base material (112) and flexible wiring board (13) is filled with resin (13b). Thus, by filling space (R2) with resin (13b), flexible wiring board (13) and rigid base material (112) are securely adhered. Such pressure-pressing is conducted under approximate conditions of temperature 200° C., pressure 40 kgf and pressing time three hours using hydraulic pressing equipment, for example.

In the following, by adding heat or the like to the entire structure, the prepreg that forms insulation layers (111, 113) is cured and integrated. By polymerizing resin (13b), the areas surrounding conductors (118a, 118b) (which will be formed in a later process) are affixed by resin (13b), and the connection reliability of each connection spot will improve between conductors (118a) and conductive layer (132) (or conductors (118b) and conductive layer (133)).

In the following, as shown in FIG. (9B), for example, on both surfaces of flexible wiring board (13), exposed between first rigid wiring board (11) and second rigid wiring board (12), separators (291, 292) that were cut in the process shown in FIG. (7) are arranged horizontally between insulation layers (111, 113). Furthermore, on the exterior (both front and back), insulation layers (115, 117) made of prepreg, for example, are arranged, and further on the exterior, conductive films (161, 162) made of copper foil, for example, are arranged respectively. Separators (291, 292) are affixed by an adhesive, for example. By arranging separators (291, 292), problems such as torn copper foil caused by plating solutions seeping into gaps on the front and back of flexible wiring board (13) may be prevented or suppressed.

In the following, the structure in such an aligned state will be pressure-pressed using hydraulic pressing equipment or the like. Then, according to requirements, thermal treatment is conducted. By doing so, first and second insulation layers (119a, 119b) are formed.

Next, after a predetermined preliminary treatment, by beaming a $CO_2$ laser from a $CO_2$ laser processing apparatus, for example, vias (114a, 116a) for connecting conductive layers (132, 133) (FIG. (3)) of flexible wiring board (13) and first and second rigid wiring boards (11, 12), along with vias (114b, 116b) for interlayer connection are formed as shown in FIG. (9C).

In the following, after desmearing (removing smears) and soft etching, PN plating (such as chemical copper plating and copper electroplating) is performed to apply copper plating on the surfaces of the entire structure. The copper from such copper plating and conductive films (161, 162) already located there become integrated to make copper film on the surfaces of the entire substrate including the interiors of vias. During that time, since flexible wiring board (13) is coated with conductive films (161, 162), it does not directly touch the plating solution. Thus, flexible wiring board (13) will not be damaged by the plating solution.

After that, through a predetermined lithography process (preliminary treatment, laminating, exposing and developing, etching, removing the film, inner-layer inspection and so forth), for example, the copper films on the surfaces of the substrate are patterned. In doing so, as shown in FIG. (9D), conductors (118a, 118b) and conductive patterns (120a, 120b) are formed to be connected to conductive layers (132, 133) of flexible wiring board (13) (see FIG. (3)). During that time, conductive films (120c, 120d) are left above separators (291, 292). After that, the copper foil surfaces are roughened through treatment. Conductors (118a, 118b), conductive patterns (120a, 120b) and conductive films (120c, 120d) may be formed by covering their surfaces with patterned plating resists and by selectively performing electrolytic plating on areas where such resists are not formed; namely, a so-called semi-additive (SAP) method may be employed.

In the following, as shown in FIG. (10A), for example, on one main surface of the structure (the side of main surface (10b) in FIG. (1)), protective film (163) is formed. While one main surface is covered by protective film (163), further upper-layer wiring layers (wiring layer, interlayer insulation layer, interlayer connection or the like) are formed only on the other side (the side of main surface (10a)) through the same process as shown in FIGS. (9A)-(9D). Namely, interlayer insulation layer (121) made of prepreg, for example, is integrated by pressing or the like. In the following, vias (122) are formed in interlayer insulation layer (121) by laser processing, for example. Then, by performing PN plating (such as chemical copper plating and copper electroplating), conductors (123) made of copper or the like are filled and the conductive film on the surface of interlayer insulation layer (121) is made thicker. After that, by patterning the surface conductive film, conductive pattern (124) made of copper, for example, is formed. Furthermore, the same process is conducted to form interlayer insulation layer (125) made of prepreg, for example, vias (126), conductors (127) made of copper, for example, and conductive pattern (128) made of copper, for example. Then, protective film (163) is removed. In doing so, on one main surface (the side of main surface (10b) in FIG. (1)) of rigid base material (112), two wiring layers (conductive pattern (112b, 120b)) are formed and electrically connected at predetermined spots; and on the other surface (the side of main surface (10a)), four wiring layers (conductive patterns (112a, 120a, 124, 128)) are formed and electrically connected at predetermined spots.

Next, as shown in FIG. (10B), using screen printing, for example, solder resists (142, 141) are formed on the front and back of the structure respectively. In the following, as shown in FIG. (11A), through a predetermined lithography process, solder resists (141, 142) are patterned (forming holes (143, 144)) to expose each pad (conductive patterns (120b, 128)) on the front and back of the structure. Holes (143, 144) may also be formed by a laser.

After that, patterned solder resists (141, 142) are cured by adding heat or the like. Furthermore, as shown in FIG. (11A), laser-cut portions (147a, 147b) are formed from the surface (the side of main surface (10a)) to flexible wiring board (13) on each edge of separator (292) by laser processing, for example. Then, as shown in FIG. (11B), by being separated at laser-cut portions (147a, 147b), structure (301) made up of separator (292) and of its upper-layer laminate is peeled and removed from flexible wiring board (13). During that time, separation is easier because of separator (292).

In the following, the same hole drilling and external processing are conducted on the edges of separator (291) (see broken lines in FIG. (11B)), and structure (302) made up of separator (291) and its upper-layer laminate is peeled and removed from flexible wiring board (13). During that time, separation is easier because of separator (291). By exposing the central portion of flexible wiring board (13), a space to allow flexible wiring board (13) to warp (bend) is formed on the front and back (in the direction of lamination) of flexible wiring board (13). Accordingly, opto-electrical hybrid wiring board (10) may be bent in the area of flexible wiring board (13).

In the following, as shown in FIG. (11D), pads (145,146) are formed respectively in holes (143, 144) of solder resists (141, 142) by chemical gold plating, for example. Then, on pads (146) arranged on the same surface of the wiring board (main surface (10b) in FIG. (1)), light-receiving element (501), light-emitting element (502), driver (503) of light-receiving element (501) and amplifier (504) of light-emitting element (502) are mounted. Also, on flexible wiring board (13) (on the side of main surface (10b)), flexible optical waveguide (600) is mounted and affixed using an adhesive, for example. In doing so, flexible optical waveguide (600) is arranged between light-receiving element (501) and light-emitting element (502). Thus, light-receiving element (501) and light-emitting element (502) are optically connected through core layer (600c).

After that, through external processing, warping correction, conductivity inspection, external inspection and final inspection, opto-electrical hybrid wiring board (10) is completed as shown previously in FIG. (1).

The above manufacturing method is preferred in manufacturing opto-electrical hybrid wiring board (10) with high connection reliability.

(Second Embodiment)

Opto-electrical hybrid wiring board (20) and its manufacturing method according to the Second Embodiment of the present invention are described by focusing on differences from the above First Embodiment. Here, the same reference numbers are applied to the elements as those shown in FIG. (1), etc., and the common portions previously described, namely, the portions whose descriptions overlap, will be omitted for the sake of convenience.

Opto-electrical hybrid wiring board (20) is also a so-called built-up multilayer printed wiring board, the same as opto-electrical hybrid wiring board (10) of the First Embodiment. As its cross-sectional structure shows in FIG. (12), opto-electrical hybrid wiring board (20) is formed basically with first rigid wiring board (11), second rigid wiring board (12), flexible wiring board (13) and various optical components (light-receiving element (501), light-emitting element (502), driver (503) of light-receiving element (501), amplifier (504) of light-emitting element (502) and flexible optical waveguide (600)) are mounted on first rigid wiring board (11) or second rigid wiring board (12). However, in opto-electrical hybrid wiring board (20), light-receiving element (501), light-emitting element (502), driver (503) and amplifier (504) are built into first rigid wiring board (11) or second rigid wiring board (12). Specifically, flexible wiring board (13) is integrated by mold resin (701) with light-receiving element (501), light-emitting element (502), driver (503), amplifier (504) and flexible optical waveguide (600) to form module (700). First rigid wiring board (11) and second rigid wiring board (12) support module (700) at its end portions, which include the overlapping portions of flexible wiring board (13) and flexible optical waveguide (600), by sandwiching the end portions with first insulation layer (119a) and second insulation layer (119b). Regarding module (700), light-receiving element (501), light-emitting element (502), driver (503) and amplifier (504) are accommodated in either first rigid wiring board (11) or second rigid wiring board (12), and main surface (10b) of flexible optical waveguide (600) is exposed.

Flexible wiring board (13) and first and second rigid wiring boards (11, 12) are electrically connected on the sides of main surfaces (10a, 10b). On the side of main surface (10a) of flexible wiring board (13), conductors (118a) and conductive layer (132) are electrically and physically connected, and so are conductors (118b) and conductive layer (133) on the side of main surface (10b) (see FIG. (3)).

In module (700), light-receiving element (501), light-emitting element (502), driver (503), amplifier (504) and flexible optical waveguide (600) are mounted on the same surface (the side of main surface (10b)) of flexible wiring board (13). Flexible optical waveguide (600) has core layer (600c) between light-receiving element (501) and light-emitting element (502). Light-receiving element (501) and light-emitting element (502) are optically connected through core layer (600c). Here, light-receiving element (501), light-emitting element (502), driver (503) and amplifier (504) are mounted with their respective electrode terminals facing the side of main surface (10b) (opposite the side of wiring board (13)), and are electrically connected to first and second rigid wiring boards (11, 12) respectively by means of vias (116a) formed over the electrode terminals.

When manufacturing opto-electrical hybrid wiring board (20), by the same steps shown in FIG. (5) previously, flexible wiring board (13) is formed first, and the above optical components (light-receiving element (501), light-emitting element (502), driver (503), amplifier (504) and flexible optical waveguide (600)) are mounted on flexible wiring board (13). Light-receiving element (501), light-emitting element (502), driver (503), amplifier (504) and flexible optical waveguide (600) are affixed by an adhesive or the like. In doing so, a laminate of flexible wiring board (13) and flexible optical waveguide (600) is formed in the central portion of flexible wiring board (13).

Next, as shown in FIG. (13A), support tape (171) (a support material) such as a UV tape with an adhesive agent applied on one surface is prepared. Then, as shown in FIG. (13B), flexible wiring board (13) with mounted optical components is arranged on the surface with applied adhesive (an adhesive layer). In doing so, flexible wiring board (13) is fixed to support tape (171) with the adhesive agent. Support tape (171) is not limited to such, and other adhesive tapes may also be used.

Next, rigid base materials (112), with through-holes (penetrating holes) (110a) and conductive patterns (112a, 112b) formed in the same steps as in FIGS. (8A)-(8D), are arranged beside flexible wiring board (13) on support tape (171). Rigid base materials (112) are aligned so that flexible wiring board (13) is sandwiched between rigid base material (112) (first rigid material) of first rigid wiring board (11) and rigid base material (112) (second rigid material) of second rigid wiring board (12). In doing so, rigid base materials (112) of first and second rigid wiring boards (11, 12) are also fixed onto support tape (171) by the adhesive.

In the following, flexible wiring board (13) and various optical components mounted on it are encapsulated with mold resin (701). In doing so, flexible wiring board (13), light-receiving element (501), light-emitting element (502), driver (503), amplifier (504) and flexible optical waveguide (600) are integrated (moduled) to become module (700). Also, using mold resin (701), flexible wiring board (13) is fixed to both rigid base material (112) of first rigid wiring board (11) and rigid base material (112) of second rigid material (12). After that, support tape (171) is removed.

In the following, as shown in FIG. (14A), for example, insulation layers (111, 113) are formed to cover areas except for the central portion of such structure; and separators (291, 292), cut in the same process as that in FIG. (7), are arranged in areas between insulation layers (111, 113) where module (700) is exposed. In addition, insulation layers (115, 117) made of prepreg, for example, are formed on the exterior (both front and back); and further on the exterior, conductive films (161, 162) made of copper foil, for example, are formed respectively. Separators (291, 292) are affixed by an adhesive, for example. By arranging separators (291, 292), problems such as torn copper foil caused by plating solutions seeping into gaps on the front and back of flexible wiring board (13) may be prevented or suppressed.

In the following, while being aligned so, the structure is pressure-pressed. During that time, resin is squeezed out from each prepreg that forms insulation layers (111, 113). Spaces between rigid base materials (112) and flexible wiring board (13) are filled with such resin. Thus, by filling spaces with such resin, flexible wiring board (13) and rigid base materials (112) are securely adhered. Such pressure-pressing is conducted under approximate conditions of temperature 200° C., pressure 40 kgf and pressing time three hours using hydraulic pressing equipment, for example.

In the following, by adding heat or the like to the entire structure, the prepreg that forms insulation layers (111, 113, 115, 117) is cured. In doing so, first and second insulation layers (119a, 119b) are formed.

Next, as shown in FIG. (14B), using the same steps as shown previously in FIGS. (9C) and (9D), vias (114a, 114b, 116a, 116b), conductors (118a, 118b), conductive patterns (120a, 120b) and conductive films (120c, 120d) are formed.

In the following, as shown in FIG. (14C), using the same steps as shown previously in FIGS. (9C) and (9D), protective film is formed on one main surface of the structure (the side of main surface (10b) in FIG. (12B)). Then, while the one surface is coated by the protective film, after the same steps as shown previously in FIGS. (9B)-(9D), further upper-layer wiring layers (wiring layer, interlayer insulation layer, interlayer connection and so forth) are formed only on the other surface (the side of main surface (10a)). In doing so, on one main surface (the side of main surface (10a)) of rigid base materials (112) respectively, four wiring layers (conductive patterns (112a, 120a, 124, 128)) are formed to be electrically connected at predetermined spots.

Next, as shown in FIG. (14D), using screen printing, for example, solder resists (142, 141) are formed on the front and back of the structure respectively. In the following, as shown in FIG. (15A), through a predetermined lithography process, solder resists (141, 142) are patterned (forming holes (143, 144)) to expose each pad (conductive patterns (120b, 128)) on the front and back of the structure. After that, patterned solder resists (141, 142) are cured by adding heat or the like. Furthermore, as shown in FIG. (15A), laser-cut portions (147a, 147b, 147c, 147d) are formed from the surface to flexible wiring board (13) on each edge of separator (292) by laser processing, for example. Then, as shown in FIG. (15B), by being separated at laser-cut portions (147a, 147b, 147c, 147d), structure (301) made up of separator (292) and of its upper-layer laminate, and structure (302) made up of separator (291) and of its upper-layer laminate, are each peeled and removed from flexible wiring board (13). During that time, separation is easier because of separators (291, 292).

Accordingly, by exposing the central portion of module (700) (area where flexible wiring board (13) and flexible optical waveguide (600) overlap), a space to allow flexible wiring board (13) and flexible optical waveguide (600) (the flexible section) to warp (bend) is formed on their front and back (in the direction of lamination). Accordingly, opto-electrical hybrid wiring board (10) may be bent at the exposed area.

In the following, as shown in FIG. (15C), pads (145, 146) are formed respectively in holes (143, 144) of solder resists (141, 142) by chemical gold plating, for example. Such pads (145, 146) are used when mounting other electronic components or mounting the opto-electrical hybrid wiring board onto another board or the like according to requirements.

After that, through external processing, warping correction, conductivity inspection, exterior inspection and final inspection, opto-electrical hybrid wiring board (20) is completed as shown previously in FIG. (12).

The present invention is not limited to such embodiments, but may be carried out by making the following modifications.

Regarding opto-electrical hybrid wiring board (20) of the Second Embodiment, optical elements (light-receiving element (501), light-emitting element (502), driver (503) and amplifier (504)) may be mounted with their electrodes facing the side of main surface (10*a*) (in the direction facing flexible wiring board (13)). For example, as shown in FIG. (16A), pads (133*a*) made from conductive layer (133) are arranged in flexible wiring board (13); then, after opening portions (136) are formed in insulative film (135) to expose pads (133*a*), bumps (137) made of solder or the like may be formed over pads (133*a*). By using such flexible wiring board (13), opto-electrical hybrid wiring board (20) may be manufactured as shown in FIG. (16B).

In the Second Embodiment, various optical components mounted on flexible wiring board (13) were integrated (moduled). However, the present invention is not limited to such. For example, as shown in FIG. (17), separate from flexible wiring board (13), light-receiving element (501) and driver (503), light-emitting element (502) and amplifier (504) are each encapsulated using mold resins (701*a*, 701*b*) respectively, and then encapsulated modules (700*a*, 700*b*) may be embedded in their respective rigid wiring boards. In an example shown in FIG. (17), using mold resins (701*a*, 701*b*), module (700*a*) (including light-receiving element (501)) is fixed to one end of the laminate of flexible wiring board (13) and flexible optical waveguide (600), and to the other end, module (700*b*) (including light-emitting element (502)) is fixed. Also, the edges of the laminate, namely, areas where flexible wiring board (13) and flexible optical waveguide (600) overlap, are inserted between first insulation layer (119*a*) and second insulation layer (119*b*) and supported. Use of such a structure is preferred in fixing flexible wiring board (13) and flexible optical waveguide (600) to first and second rigid wiring boards (11, 12). Then, core layer (600*c*) is provided for light-receiving element (501) and light-emitting element (502) built into each rigid wiring board to optically connect both elements. Furthermore, the above-described effect by via connections may also be achieved.

Alternatively, as shown in FIG. (18), light-receiving element (501) and light-emitting element (502) may be built into first and second rigid wiring boards (11, 12) respectively, while driver (503) and amplifier (504) are mounted on the surfaces of first and second rigid wiring boards (11, 12) respectively. Furthermore, as shown in FIG. (19), optical elements with electrodes on both of their surfaces may also be used. In such a case, optical elements are flip-chip mounted on flexible wiring boards (13) using solder bumps or the like, and are connected to first and second rigid wiring boards (11, 12) by via connections.

In such structures, any positions or configurations may be employed for regions (R3) (regions where first and second insulation layers (119*a*, 119*b*) sandwich flexible wiring board (13)). Namely, as shown in FIG. (20A), for example, the regions covering the entire area in the direction of the width of first and second rigid wiring boards (11, 12) respectively may be set as regions (R3). Alternatively, as shown in FIG. (20B), for example, by selectively removing the portions of rigid base materials (112) into which flexible wiring board (13), etc., is inserted, concave portions (11*a*, 12*a*) are formed, which are then to become regions (R3).

As shown in FIG. (21A), upper-layer vias may be omitted on one main surface (for example, the side of main surface (10*b*)). In an example shown in FIG. (21A), first and second rigid wiring boards (11, 12) support flexible wiring board (13) by sandwiching its ends with first insulation layer (119*a*) and solder resist (142) (which corresponds to the second insulation layer). Also, flexible optical waveguide (600) is laminated directly on flexible wiring board (13) using an adhesive. On the other hand, flexible optical waveguide (600) may be laminated onto first and second rigid wiring boards (11, 12) as shown in FIG. (21B).

As shown in FIG. (22), vias (112*c*) are formed in rigid base materials (112) (core substrates), and filled vias are formed by filling conductor (112*d*) in vias (112*c*). Then, using such filled vias, the wiring of first and second rigid wiring boards (11, 12) and the wiring of flexible wiring board (13) may be electrically connected.

A structure may be employed in which multiple flexible wiring boards (13) are connected to each rigid wiring board by shifting their positions in the direction of the thickness (vertically) of each rigid wiring board. For example, as shown in FIG. (23), a structure may be employed in which two sheets of flexible wiring board (13) are arranged in such a way that they are stacked on top of each other with a predetermined space in between, and are connected to first rigid wiring board (11) at one end, and to second rigid wiring board (12) at the other end. With such a structure, various optical elements (light-receiving element (501), light-emitting element (502), driver (503), amplifier (504) and flexible optical waveguide (600)) may be arranged on both surfaces (main surfaces (10*a*, 10*b*)) of an opto-electrical hybrid wiring board. In first and second rigid wiring board (11, 12), two sheets of flexible wiring board (13) are supported at each end by being sandwiched between their respective first insulation layer (119*a*) and second insulation layer (119*b*), which is used in common to support both sheets.

Flexible wiring board (13) and flexible optical waveguide (600) may be arranged parallel by shifting them in a horizontal direction (perpendicular to the direction of their thickness). In such a case, as shown in FIG. (24A), for example, only flexible wiring board (13) may be inserted into first and second rigid wiring boards (11, 12), while flexible optical waveguide (600) is laminated on first and second wiring boards (11, 12). Alternatively, as shown in FIG. (24B), optical elements (light-receiving element (501), light-emitting element (502), driver (503) and amplifier (504)) may be built into first and second rigid wiring boards (11, 12), while both flexible wiring board (13) and flexible optical waveguide (600) are inserted into first and second rigid wiring boards (11, 12).

Furthermore, as shown in FIG. (24C), flexible wiring board (13) and flexible optical waveguide (600) may be arranged so that they cross each other.

In the above embodiments, first and second rigid wiring boards (11, 12) and flexible wiring board (13) are electrically connected by filled vias as shown in FIG. (25A) (see FIG. (3)). However, the present invention is not limited in such a way. For example, as shown in FIG. (25B), both wiring boards may be connected by conformal vias filled with insulative material (insulative resin) (118*c*). Otherwise, as shown in FIG. (25C), for example, both wiring boards may be connected by through-holes filled with insulative material (insulative resin) (118*c*). Usually, conformal vias rather than through-holes, and filled vias rather than conformal vias are resistant to impact with fewer occurrences of cracking or the like. Inside such conformal vias or through-holes, conductive resin may also be filled.

A method for connecting light-receiving element (501), light-emitting element (502), driver (503) and amplifier (504) is not limited to a flip-chip connection, but any other method may also be employed. For example, wire bonding, plated through-hole connections or the like may be used. Also, any material may be used for electrodes and wiring. For example, both wiring boards may be electrically connected using anisotropic conductive film (ACF) connection or Au—Au connection.

In the above embodiments, the material, size, number of layers and so forth of each layer may be modified. For example, instead of prepreg (insulation layers (111, 113, 115, 117, etc.)), resin coated copper foil (RCF) may also be used.

Obviously, numerous modifications and variations of the present invention are possible in light of the above teachings. It is therefore to be understood that within the scope of the appended claims, the invention may be practiced otherwise than as specifically described herein.

What is claimed is:

1. An opto-electrical hybrid wiring board, comprising:
    a flexible wiring board;
    a first rigid wiring board and a second rigid wiring board that are connected to each other by the flexible wiring board, at least one end of the flexible wiring board being inserted into and supported by either the first rigid wiring board or the second rigid wiring board, the first or the second rigid wiring board and the flexible wiring board being electrically connected to each other by a via that connects wiring of the first or second rigid wiring board and wiring of the flexible wiring board, said via extending through a portion of the first or second wiring board, penetrating a surface of the flexible wiring board and terminating at a conductor layer of the flexible wiring board at portions of the flexible wiring board that are inserted into the first rigid wiring board or the second rigid wiring board;
    a light-emitting element and a light-receiving element, one of the light-emitting element and the light-receiving element being arranged on the first rigid wiring board and the other of the light-emitting element and the light-receiving element being arranged on the second rigid wiring board; and
    a flexible optical waveguide configured to optically connect the light-emitting element and the light-receiving element.

2. The opto-electrical hybrid wiring board according to claim 1, wherein the flexible optical waveguide is arranged on the flexible wiring board.

3. The opto-electrical hybrid wiring board according to claim 1, wherein at least one end of the flexible optical waveguide is arranged on the first rigid wiring board or the second rigid wiring board.

4. The opto-electrical hybrid wiring board according to claim 1, wherein at least either the first rigid wiring board or the second rigid wiring board includes a core substrate made of rigid base material, and a first insulation layer and a second insulation layer respectively formed on a front surface and a back surface of the core substrate, and supports the flexible wiring board at one end by sandwiching the end with the first insulation layer and the second insulation layer.

5. The opto-electrical hybrid wiring board according to claim 4, wherein the first insulation layer and the second insulation layer are each made of prepreg, RCF or solder resist.

6. The opto-electrical hybrid wiring board according to claim 4, wherein at least either the first rigid wiring board or the second rigid wiring board supports the flexible wiring board at the one end by sandwiching overlapping portions of the flexible wiring board and the flexible optical waveguide at the one end with the first insulation layer and the second insulation layer.

7. The opto-electrical hybrid wiring board according to claim 6, wherein the light-emitting element and the light-receiving element are built into the first rigid wiring board and second rigid wiring board respectively.

8. The opto-electrical hybrid wiring board according to claim 1,
    wherein the flexible wiring board forms an integrated module with the light-emitting element, the light-receiving element and the flexible optical waveguide, and
    wherein at least either the first rigid wiring board or the second rigid wiring board has a core substrate made of rigid base material, and has a first insulation layer and a second insulation layer respectively formed on a front surface and a back surface of the core substrate, and supports the module at one end by sandwiching the one end with the first insulation layer and the second insulation layer.

9. The opto-electrical hybrid wiring board according to claim 8, wherein a flexible section of the module is exposed between the first rigid wiring board and the second rigid wiring board.

10. The opto-electrical hybrid wiring board according to claim 8, wherein the light-emitting element and the light-receiving element are built into the first rigid wiring board and second rigid wiring board respectively.

11. The opto-electrical hybrid wiring board according to claim 8, wherein the first insulation layer and the second insulation layer are each made of prepreg, RCF or solder resist.

12. The opto-electrical hybrid wiring board according to claim 1, wherein at least either the first rigid wiring board or the second rigid wiring board has a core substrate made of rigid base material, and the wiring of the first rigid wiring board or the second rigid wiring board that includes the core substrate and the wiring of the flexible wiring board are electrically connected through a via formed in the core substrate.

13. The opto-electrical hybrid wiring board according to claim 12, wherein the via formed in the core substrate is a filled via.

* * * * *